(12) United States Patent
Yamamoto et al.

(10) Patent No.: US 11,538,935 B2
(45) Date of Patent: Dec. 27, 2022

(54) SILICON CARBIDE SEMICONDUCTOR DEVICE

(71) Applicant: DENSO CORPORATION, Kariya (JP)

(72) Inventors: Tsuyoshi Yamamoto, Kariya (JP); Ryota Suzuki, Toyota (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 211 days.

(21) Appl. No.: 17/117,413

(22) Filed: Dec. 10, 2020

(65) Prior Publication Data

US 2021/0184031 A1 Jun. 17, 2021

(30) Foreign Application Priority Data

Dec. 12, 2019 (JP) .............................. JP2019-224343

(51) Int. Cl.
| | |
|---|---|
| *H01L 29/78* | (2006.01) |
| *H01L 29/06* | (2006.01) |
| *H01L 29/16* | (2006.01) |
| *H01L 29/66* | (2006.01) |

(Continued)

(52) U.S. Cl.
CPC ........ *H01L 29/7813* (2013.01); *H01L 21/046* (2013.01); *H01L 21/049* (2013.01); *H01L 29/0634* (2013.01); *H01L 29/0696* (2013.01); *H01L 29/1095* (2013.01); *H01L 29/1608* (2013.01); *H01L 29/66068* (2013.01); *H01L 29/7815* (2013.01)

(58) Field of Classification Search
CPC ............ H01L 29/7815; H01L 29/0634; H01L 29/0696; H01L 29/1608; H01L 29/7813
See application file for complete search history.

(56) References Cited

U.S. PATENT DOCUMENTS 7,994,513 B2 * 8/2011 Yamamoto .......... H01L 29/0623
257/E29.069
8,193,564 B2 * 6/2012 Suzuki .................. H01L 29/086
257/219

(Continued)

FOREIGN PATENT DOCUMENTS

GB         2589373 A  *  6/2021  ......... H01L 29/0607
WO   WO-2019044921 A1 *  3/2019  ......... H01L 29/0619

*Primary Examiner* — Bilkis Jahan
*Assistant Examiner* — Victor V Barzykin
(74) *Attorney, Agent, or Firm* — Posz Law Group, PLC

(57) ABSTRACT

A SiC semiconductor device includes a main cell region and sense cell region being electrically isolated by an element isolation portion. The SiC semiconductor device includes a substrate, a first impurity region, a first current dispersion layer, first deep layers, a second current dispersion layer, a second deep layer, a base region, a trench gate structure, a second impurity region, first electrodes and a second electrode. The second impurity region, the first electrodes, and the second electrode are disposed at the main cell region and the sense cell region to form a vertical semiconductor element. The vertical semiconductor element allows a current flowing between the first electrode and the second electrode through a voltage applied to the gate electrode. The spacing interval between the deep layers at the element isolation portion is shorter than or equal to a spacing interval between the deep layers at the main cell region.

18 Claims, 24 Drawing Sheets

(51) Int. Cl.
  *H01L 29/10* (2006.01)
  *H01L 21/04* (2006.01)

(56) References Cited

U.S. PATENT DOCUMENTS

| | | | | |
|---|---|---|---|---|
| 8,634,215 | B2* | 1/2014 | Deboy | H01L 29/7806 |
| | | | | 363/52 |
| 10,516,046 | B2* | 12/2019 | Takeuchi | H01L 21/761 |
| 11,063,145 | B2* | 7/2021 | Mitani | H01L 29/78 |
| 2009/0280609 | A1* | 11/2009 | Akiba | H01L 29/0634 |
| | | | | 438/270 |
| 2010/0320461 | A1* | 12/2010 | Su | H01L 29/0646 |
| | | | | 257/E27.06 |
| 2012/0319136 | A1 | 12/2012 | Noborio et al. | |
| 2014/0084361 | A1* | 3/2014 | Saito | H01L 29/7802 |
| | | | | 257/329 |
| 2014/0175459 | A1* | 6/2014 | Yamamoto | H01L 29/1608 |
| | | | | 257/77 |
| 2015/0333127 | A1* | 11/2015 | Morino | H01L 21/761 |
| | | | | 257/77 |
| 2016/0211361 | A1* | 7/2016 | Nishimura | H01L 29/7805 |
| 2017/0263757 | A1* | 9/2017 | Saikaku | H01L 29/1608 |
| 2017/0299639 | A1* | 10/2017 | Shibib | H01L 21/823487 |
| 2018/0047722 | A1* | 2/2018 | Nishimura | H01L 29/7803 |
| 2018/0183427 | A1* | 6/2018 | Nakajima | H03K 17/6874 |
| 2019/0288107 | A1 | 9/2019 | Saikaku et al. | |
| 2019/0341483 | A1* | 11/2019 | Harada | G01R 19/10 |
| 2019/0341484 | A1* | 11/2019 | Takeuchi | H01L 29/0623 |
| 2020/0168732 | A1* | 5/2020 | Mitani | H01L 29/66068 |

* cited by examiner

SILICON CARBIDE SEMICONDUCTOR DEVICE

CROSS REFERENCE TO RELATED APPLICATION

This application is based on Japanese Patent Application No. 2019-224343 filed on Dec. 12, 2019, the disclosure of which is incorporated herein by reference.

TECHNICAL FIELD

The present disclosure relates to a silicon carbide (SiC) semiconductor device.

BACKGROUND

A SiC semiconductor device may include a vertical type MOSFET with a trench structure having a main cell and a sense cell. In the SiC semiconductor device, a current flowing through the main cell may be detected by the sense cell.

SUMMARY

The present disclosure describes a SiC semiconductor device including a cell region having a main cell region and sense cell region being electrically isolated by an element isolation portion. The SiC semiconductor device includes a substrate, a first impurity region, a first current dispersion layer, first deep layers, a second current dispersion layer, a second deep layer, a base region, a trench gate structure, a second impurity region, first electrodes and a second electrode.

BRIEF DESCRIPTION OF DRAWINGS

Other objects, features and advantages of the present disclosure will become more apparent from the following detailed description made with reference to the accompanying drawings. In the drawings.

DETAILED DESCRIPTION

Figure 1A:
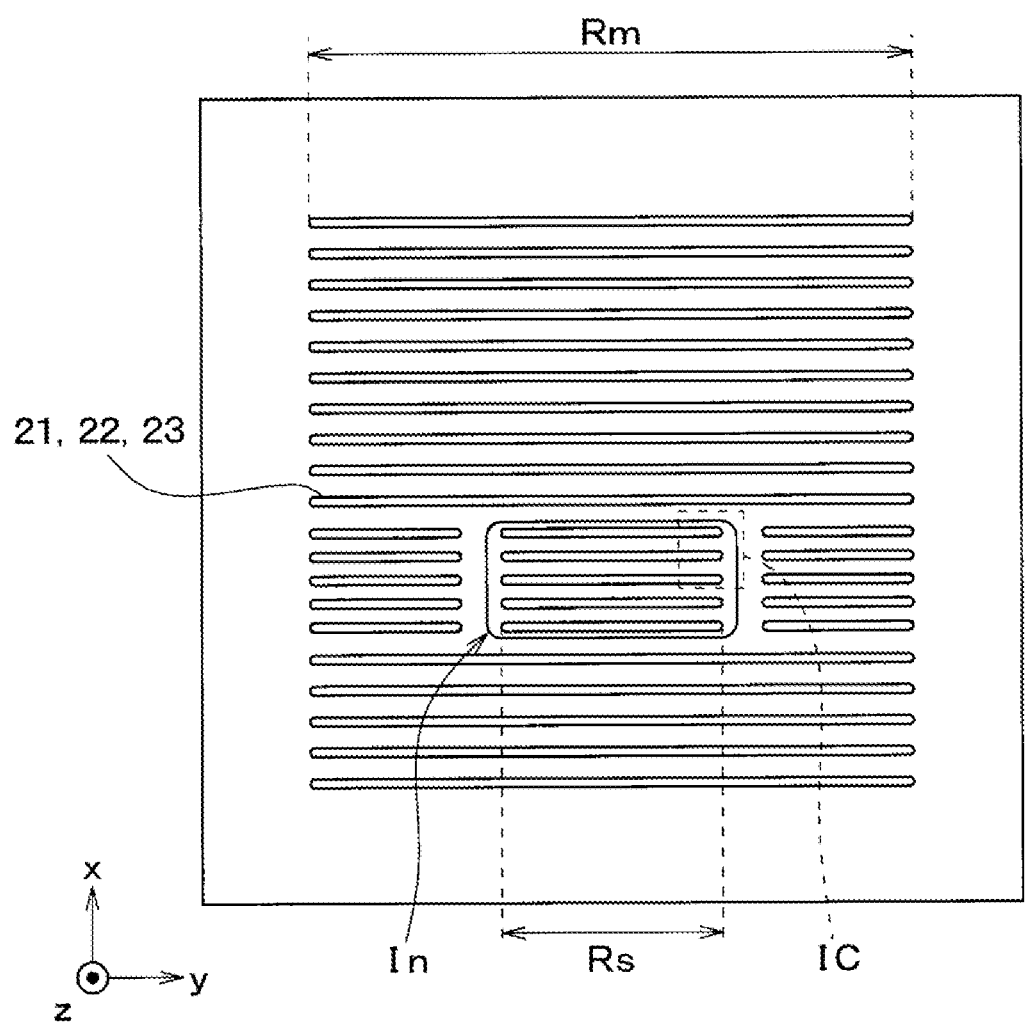
FIG. 1A is a top layout diagram showing a SiC semiconductor device according to a first embodiment.

A SiC semiconductor device may include an element isolation layer to electrically isolate a main cell region from a sense region, and the p-type base layer in each of the main cell region and the sense cell region is divided by an element isolation layer. The main cell region includes the main cell, and the sense cell region includes the sense cell. The SiC semiconductor may include an electric field relaxation layer to reduce electric field concentration at the bottom portion of the element isolation layer. The electric field relaxation layer isolates the main region from the sense region at the element isolation layer.

Although element isolation is performed between the main cell region and the sense region in the above-mentioned SiC semiconductor device, the element isolation layer has, for example, an oxide film and is in a floating state. Therefore, equipotential easily enters and a withstand voltage may not be obtained. Therefore, a local breakdown may occur in this element isolation layer, and an avalanche current may flow intensively into the sense cell region so that a device breakdown may occur.

According to a first aspect of the present disclosure, a silicon carbide semiconductor device includes a cell region having a main cell region and sense cell region being electrically isolated by an element isolation portion. The silicon carbide semiconductor device includes a substrate, a first impurity region, a first current dispersion layer, first deep layers, a second current dispersion layer, a second deep layer, a base region, a trench gate structure, a second impurity region, first electrodes and a second electrode.

The substrate is made of silicon carbide and has either a first conductivity type or a second conductivity type. The first impurity region is disposed on a surface of the substrate, and the first impurity region has the first conductivity type and has a lower impurity concentration than the substrate. The first current dispersion layer is made of silicon carbide and has the first conductivity type, and the first current dispersion layer is disposed on the first impurity region. The first deep layers are made of silicon carbide and has the second conductivity type, and the first deep layers is disposed above the first impurity region. Each of the first deep layers and the first current dispersion layer are disposed alternately with respect to a plane direction of the substrate. The second current dispersion layer is made of silicon carbide and has the first conductivity type, and the second current dispersion layer is disposed on the first current dispersion layer and the first deep layers, and connected to the first current dispersion layer. The second deep layer is made of silicon carbide and has the second conductivity type, and the second deep layer is disposed on the first current dispersion layer and the first deep layers, and connected to the first deep layers. The base region is made of silicon carbide and has the second conductivity type, and the base region is disposed on the second current dispersion layer and the second deep layer, and connected to the second deep layers. The trench gate structure includes a trench, a gate insulation film, and a gate electrode, and the trench extends along a direction as a longitudinal direction and is disposed to be deeper than the base region. The gate insulation film is disposed at an inner wall surface of the trench, and the gate electrode is disposed on the gate insulation film inside the trench. The second impurity region is made of silicon carbide and has the first conductivity type, and is in contact with the trench gate structure at a surface layer portion of the base region. The first electrodes are separately provided in the sense cell region and the main cell region, and the first electrodes are electrically connected to the second impurity region at the main cell region and the second impurity region at the sense cell region, respectively, and electrically connected to the base region. The second electrode is disposed at a rear surface of the substrate, and electrically connected to the substrate.

The first current dispersion layer, the first deep layers, the second current dispersion layer, the second deep layer, the base region, and the trench gate structure are disposed at the cell region and the element isolation region. The second impurity region, the first electrodes, and the second electrode are disposed at the main cell region and the sense cell region to form a vertical semiconductor element at each of the main cell region and the sense cell region. The vertical semiconductor element is configured to allow a current flowing between the first electrode and the second electrode through a voltage applied to the gate electrode. At the element isolation portion, the first deep layers are disposed at both sides of the trench gate structure and are separated with a spacing interval. The spacing interval between the first deep layers at the element isolation portion is shorter than or equal to a spacing interval between the first deep layers at the main cell region.

Since the trench gate structure is disposed at the element isolation portion to perform the element isolation, the trench gate structure may also be a field-plate structure so that the withstand voltage of the element isolation portion can be attained even though a voltage is applied to the second electrode.

The spacing interval between the first deep layers at the element isolation portion is set to be shorter than or equal to the spacing interval between the first deep layers at the cell region. Therefore, it is possible that the withstand voltage of the element isolation portion is larger than or equal to the withstand voltage of the main cell region. In a situation where a breakdown occurs, the breakdown may firstly occur at the main cell region or the breakdown may occur at the main cell region and the element isolation portion at the same time without having a situation where the breakdown firstly occurs at the element isolation portion. Therefore, it is possible to inhibit the situation where the breakdown firstly occurs at the element isolation portion having a smaller area, and inhibit the situation of having a device breakdown caused by the avalanche current intensively flowing into the sense cell region.

According to a second aspect of the present disclosure, a silicon carbide semiconductor device includes a cell region having a main cell region and sense cell region being electrically isolated by an element isolation portion. The silicon carbide semiconductor device includes a substrate, a first impurity region, a current dispersion layer, deep layers, a base region, a trench gate structure, a second impurity region, first electrodes and a second electrode.

The substrate is made of silicon carbide and has either a first conductivity type or a second conductivity type. The first impurity region is disposed on a surface of the substrate, and the first impurity region has the first conductivity type and has a lower impurity concentration than the substrate. The current dispersion layer is made of silicon carbide and has the first conductivity type, and the current dispersion layer is disposed on the first impurity region. The deep layers are made of silicon carbide and has the second conductivity type, and the first deep layers is disposed above the first impurity region. Each of the deep layers and the current dispersion layer are disposed alternately with respect to a plane direction of the substrate. The base region is made of silicon carbide and has the second conductivity type, and the base region is disposed on the current dispersion layer and the deep layer, and connected to the deep layers. The trench gate structure includes a trench, a gate insulation film, and a gate electrode, and the trench extends along a direction as a longitudinal direction and is disposed to be deeper than the base region. The gate insulation film is disposed at an inner wall surface of the trench, and the gate electrode is disposed on the gate insulation film inside the trench. The second impurity region is made of silicon carbide and has the first conductivity type, and is in contact with the trench gate structure at a surface layer portion of the base region. The first electrodes are separately provided in the sense cell region and the main cell region, and the first electrodes are electrically connected to the second impurity region at the main cell region and the second impurity region at the sense cell region, respectively, and electrically connected to the base region. The second electrode is disposed at a rear surface of the substrate, and electrically connected to the substrate.

The current dispersion layer, the deep layers, the base region, and the trench gate structure are disposed at the cell region and the element isolation region. The second impurity region, the first electrodes, and the second electrode are disposed at the main cell region and the sense cell region to form a vertical semiconductor element at each of the main cell region and the sense cell region. The vertical semiconductor element is configured to allow a current flowing between the first electrode and the second electrode through a voltage applied to the gate electrode. At the element isolation portion, the first deep layers are disposed at both sides of the trench gate structure and are separated with a spacing interval. The spacing interval between the deep layers at the element isolation portion is shorter than or equal to a spacing interval between the deep layers at the main cell region.

According to the above configuration, the spacing interval between the deep layers at the element isolation portion is set to be shorter than or equal to the spacing interval between the deep layers at the cell region having the main cell region and the sense cell region. It is possible that the withstand voltage of the element isolation portion is higher than or equal to the withstand voltage of the main cell region. In a situation where the breakdown occurs, the breakdown may firstly occur at the main cell region or the breakdown may occur at the element isolation portion and the main cell region at the same time without having a situation where the breakdown firstly occurs at the element isolation portion.

Therefore, the advantageous effects similar to the one attained the first aspect of the present disclosure may also be achieved.

Hereinafter, embodiments of the present disclosure will be described with reference to the drawings. In the following embodiments, the same or equivalent parts are denoted by the same reference numerals.

First Embodiment

The following describes a first embodiment. As illustrated in FIG. 1A, an SiC semiconductor device according to the present embodiment includes a main cell region Rm provided with a main cell and a sense cell region Rs provided with a sense cell. The main cell region Rm and the sense cell region Rs are isolated by an element isolation layer In, and are electrically isolated from each other. The main cell region Rm has a rectangular frame shape which is partially cut out, and the sense cell region Rs is disposed in the main cell region Rm is disposed so that a portion of the sense cell region Rs is adjacent to the main cell. The sense cell region Rs is formed to be surrounded by the main cell region Rm. An outer peripheral withstand voltage region is provided at the outermost periphery surrounding the main cell region Rm or the sense cell region Rs; however, the outer peripheral withstand voltage region is omitted in the drawings. The outer peripheral withstand voltage region includes, for example, a guard ring. The withstand voltage may also be called a breakdown voltage.

The main cell region Rm and sense cell region Rs are respectively provided with MOSFETs of the trench gate structure with the same structure. Here, a situation where an n-channel MOSFET is provided as the vertical MOSFET will be described as an example.

Figure 1B:
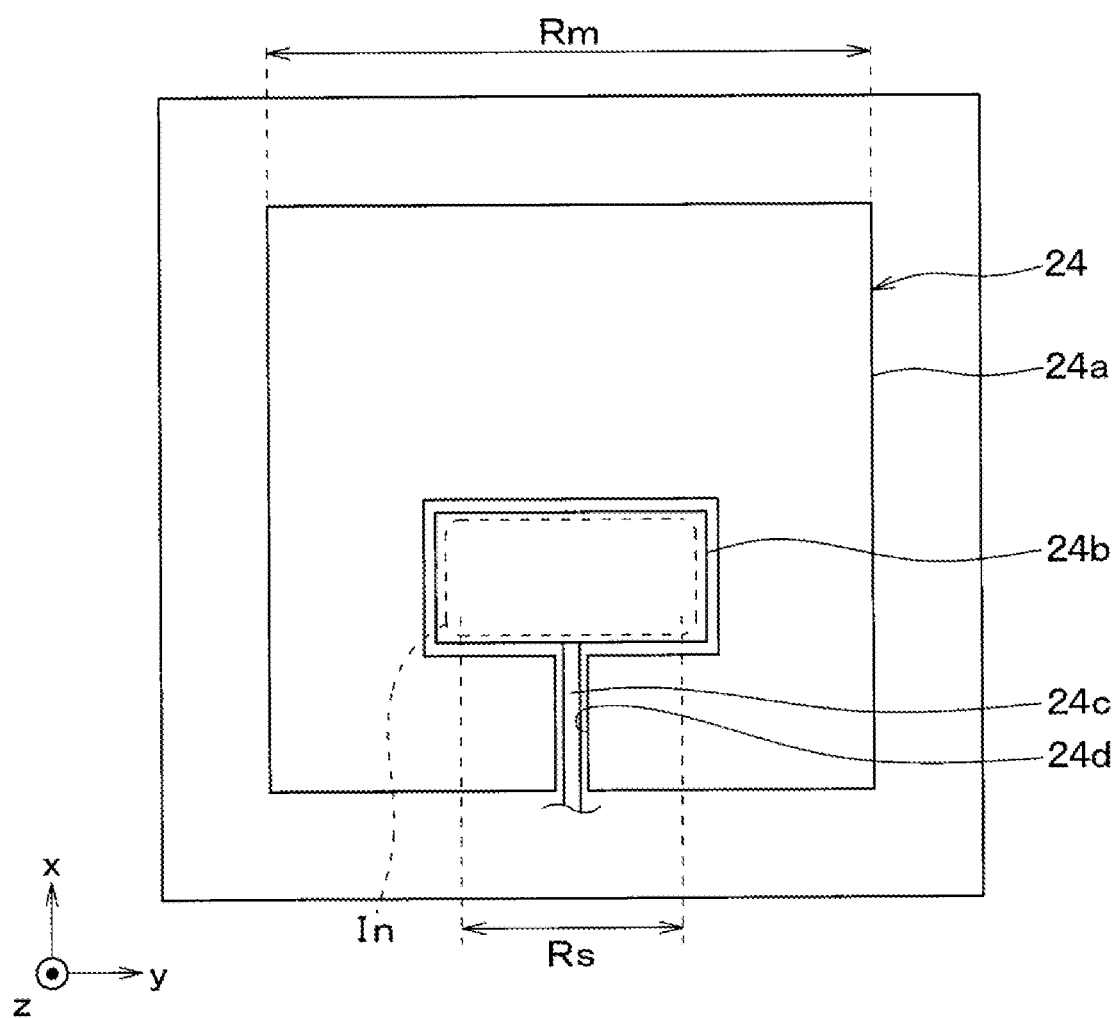
FIG. 1B is a top layout diagram in which a source electrode is disposed with respect to FIG. 1A.
Figure 1C:
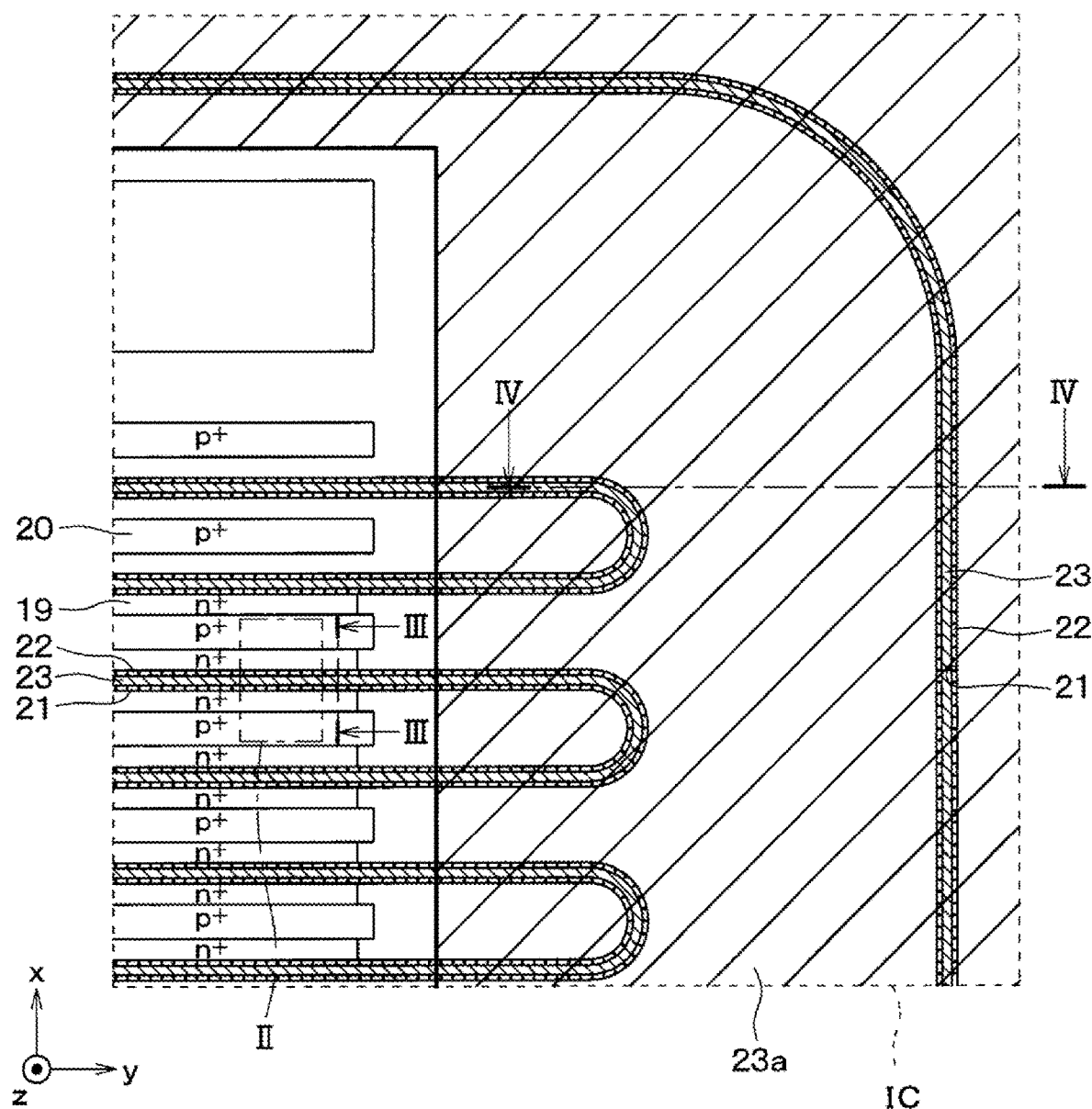
FIG. 1C is a partial enlarged view of a region IC in FIG. 1A.
Figure 2:
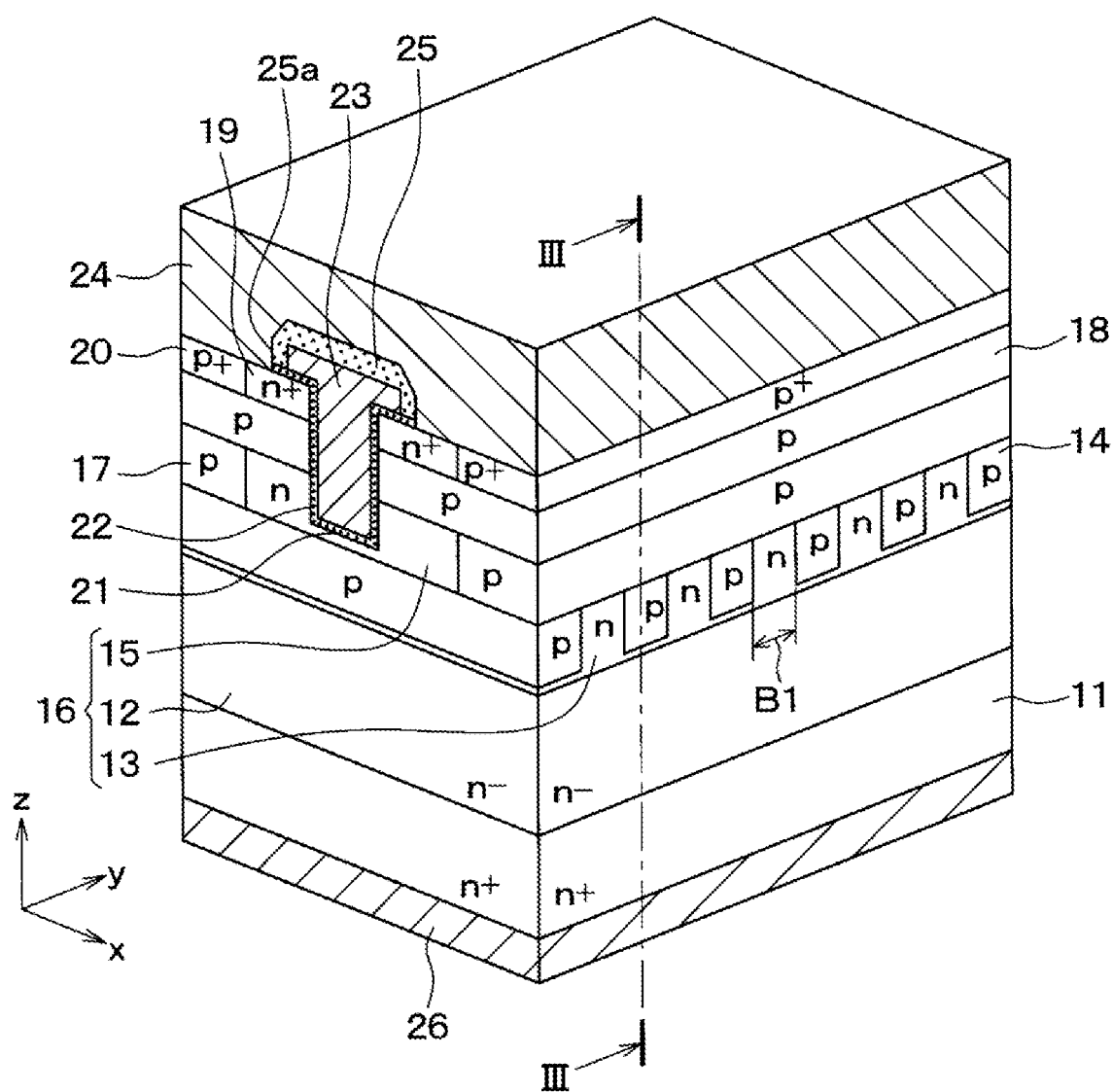
FIG. 2 is an enlarged perspective sectional view of a region in FIG. 1C.

Hereinafter, a structure of the semiconductor device according to the present embodiment will be described with reference to FIGS. 1A to 1C and FIGS. 2 to 4. FIG. 2 illustrates one cell of the vertical MOSFET in the main cell region Rm illustrated by the region II surrounded by the broken line in FIG. 1C. The cell of the vertical MOSFET illustrated in this drawing has multiple cells aligned in a vertical direction as view on the paper sheet of FIG. 1A. Further, although the vertical MOSFET in the sense cell region Rs is illustrated, the vertical MOSFET in the main cell region Rm also has the same cross-sectional structure.

Figure 3:
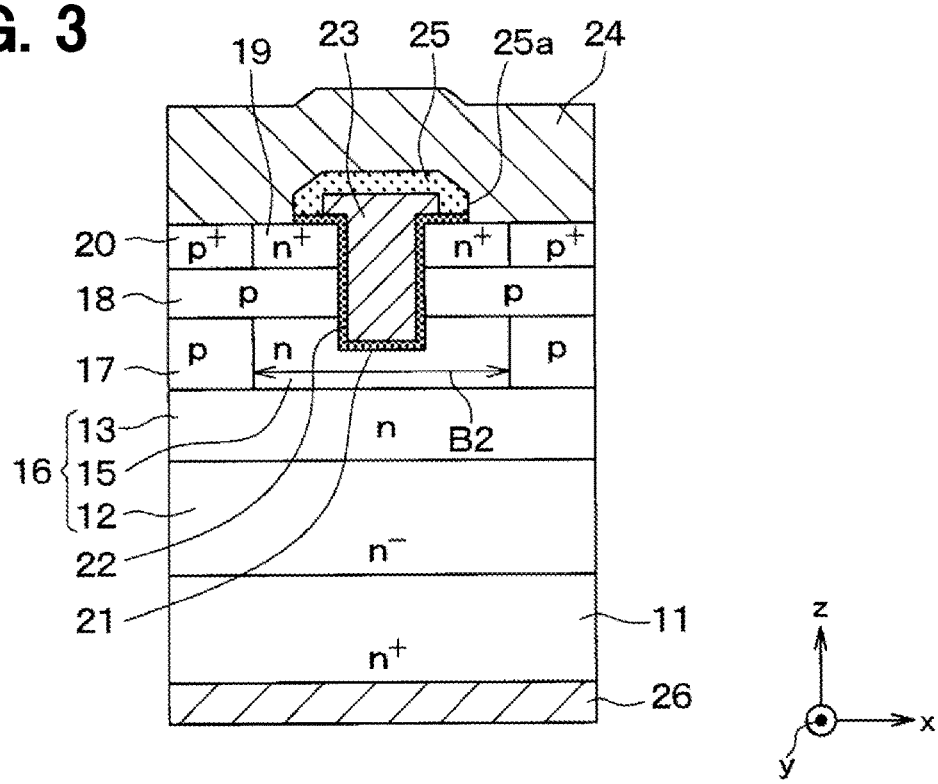
FIG. 3 is a cross-sectional view taken along line III-III in FIGS. 1C and 2.
Figure 4:
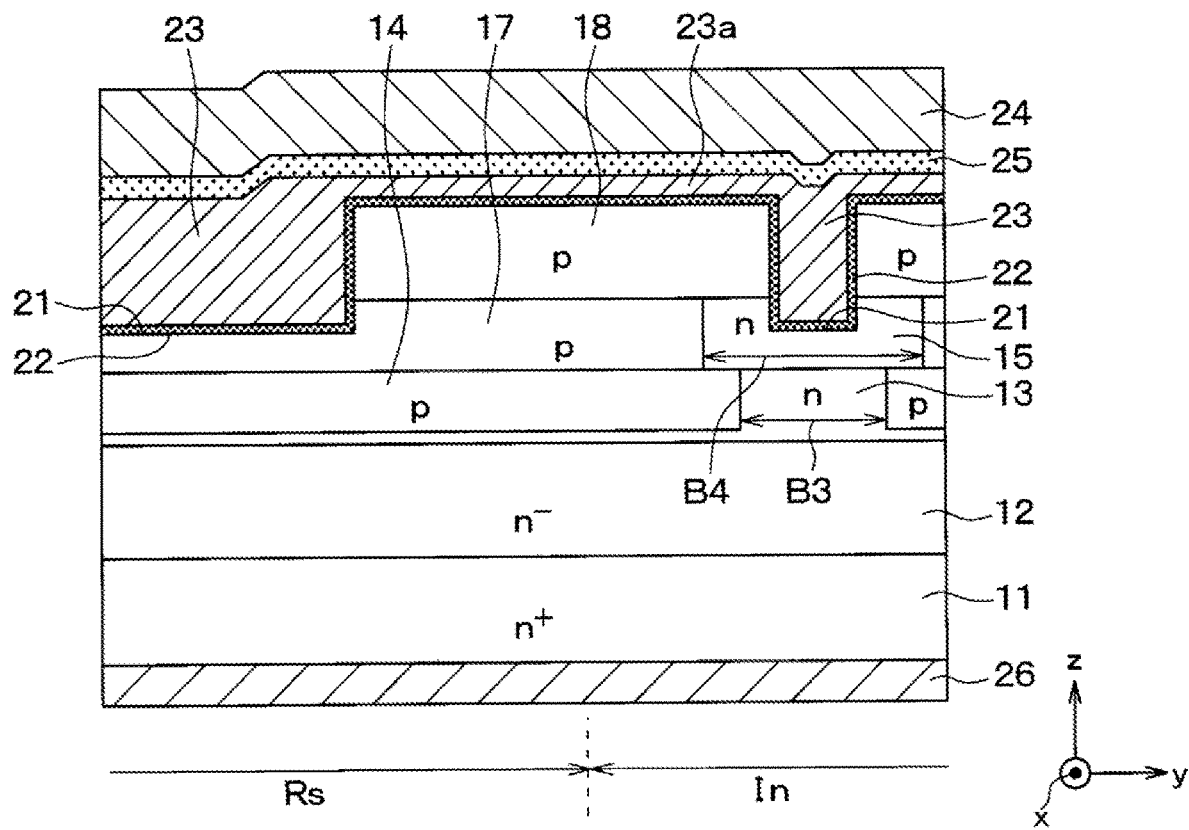
FIG. 4 is a cross-sectional view taken along line IV-IV in FIG. 1C.

As illustrated in FIGS. 2 to 4, the SiC semiconductor device includes an $n^+$-type substrate 11 made of SiC. In the present embodiment, the substrate 11 has an off-angle of 0 to 8 degrees with respect to, for example, a (0001) Si plane, and the substrate 11 has an n-type impurity concentration of, for example, $1.0 \times 10^{19}/cm^3$, such as nitrogen or phosphorus, and a thickness of about 300 μm.

In FIGS. 1 to 2, a plane direction of the substrate 11 is an xy-plane, a <11-20> direction in the xy-plane is a y-axis direction, and a direction orthogonal to the y-axis direction is an x-axis direction. A direction normal to the plane direction of the substrate 11 is a z-axis direction. The vertical direction as viewed on the paper sheet of FIG. 1A corresponds to the x-axis direction, the horizontal direction as viewed on the paper sheet of FIG. 1A corresponds to the y-axis direction, and a direction normal to the paper sheet of FIG. 1A corresponds to the z-axis direction.

An $n^-$-type layer 12 made of SiC having an n-type impurity concentration of nitrogen, phosphorus and the like of, for example, $5.0 \times 10^{15}/cm^3$ to $10.0 \times 10^{15}/cm^3$ and a thickness of about 10 μm to 15 μm is formed on a surface of the substrate 11. Although the impurity concentration of the n⁻-type layer 12 may be kept constant in a depth direction, the concentration distribution may be inclined so that the concentration of the n⁻-type layer 12 on the side of the substrate 11 is higher than that on the side of the substrate 11. For example, the n⁻-type layer 12 may have the impurity concentration of a portion separated by about 3 µm to 5 µm from the surface of the substrates 11 higher than that of other portions by about $2.0 \times 10^{15}/cm^3$. With the configuration described above, an internal resistance of the n⁻-type layer 12 can be reduced, and an on-resistance of the n⁻ layer 12 can be reduced. In the present embodiment, the n⁻-type layer 12 corresponds to a first impurity region.

A first current dispersion layer 13 having an impurity concentration higher than that of the n⁻-type layer 12 is formed in a surface layer portion of the n⁻-type layer 12. The first current dispersion layer 13 includes an n-type impurity layer into which nitrogen, phosphorus or the like is introduced. The first current dispersion layer 13 has an impurity concentration equal to or higher than that of the n-type layer 12. The impurity concentration of the first current dispersion layer 13 may be higher than that of the n-type layer 12. The first current dispersion layer 13 has a depth of 0.3 µm to 1.5 µm. A specific impurity concentration of the first current dispersion layer 13 will be described later.

Multiple p-type first deep layers 14 having a p-type impurity concentration of boron or the like of, for example, $2.0 \times 10^{17}/cm^3$ to $2.0 \times 10^{18}/cm^3$, are formed in the first current dispersion layer 13. In the present embodiment, the multiple first deep layers 14 extend along the x-axis direction so as to form stripes, and are aligned at regular intervals along the y-axis direction.

The first deep layers 14 are formed shallower than the first current dispersion layer 13. In other words, the first deep layers 14 are formed so as to have bottoms located in the first current dispersion layer 13. In other words, the first deep layers 14 are formed so that the first current dispersion layer 13 is positioned between the first deep layers 14 and the n⁻-type layer 12.

In the present embodiment, the first deep layers 14 are formed by ion implantation as will be described later, but are formed so that a length of the first deep layers 14 in the y-axis direction is 0.3 µm or more in consideration of a processing limit of photolithography at the time of ion implantation. A spacing interval between the adjacent first deep layers 14 along the y-axis direction (hereinafter referred to as an interval B1 between the first deep layers 14), that is, a width of the first current dispersion layer 13 sandwiched between the adjacent first deep layers 14 along the y-axis direction is narrower than at least an interval between adjacent trenches 21. The spacing interval B1 between the first deep layers 14 is designed based on the relationship with the withstand voltage of the element isolation portion In described later while attaining a desirable on-resistance in view of the width of a depletion layer extending toward the first current dispersion layer 13.

On the first current dispersion layer 13 and the first deep layers 14, a second current dispersion layer 15, which has an n-type impurity layer with introduced nitrogen or phosphorus and has a thickness of 0.5 µm to 2 µm, is formed. The n-type impurity concentration of the second current dispersion layer 15 is, for example, $1.0 \times 10^{16}/cm^3$ to $5.0 \times 10^{17}/cm^3$, which is equal to or higher than that of the first current dispersion layer 13. The impurity concentration of the second current dispersion layer 15 may be higher than that of the first current dispersion layer 15. Since the second current dispersion layer 15 is connected to the first current dispersion layer 13, in the present embodiment, n⁻-type layer 12, the first current dispersion layer 13 and the second current dispersion layer 15 are connected to form a drift layer 16.

In the second current dispersion layer 15, multiple second deep layers 17 having a p-type impurity concentration of boron or the like of, for example, $2.0 \times 10^{17}/cm^3$ to $2.0 \times 10^{18}/cm^3$ and a thickness equal to that of the second current dispersion layer 15 are formed so as to penetrate through the second current dispersion layer 15. In the present embodiment, the second deep layers 17 extend along the y-axis direction. In other words, the second deep layers 17 extend in a direction intersecting with each of the first deep layers 14. Each of the second deep layers 17 is connected to the multiple first deep layers 14.

The second deep layers 17s are formed to sandwich the trench 21 described hereinafter. Further, the second deep layers 17 are formed at a position apart from the trench 21. The spacing interval B2 between the second deep layers 17 is larger than the spacing interval B1 between the first deep layers 14.

A p-type base region 18 is formed on the second current dispersion layer 15 and the second deep layers 17. Subsequently, n⁺-type source regions 19 and p⁺-type contact layers 20 are formed in a surface layer portion of the base region 18. The source regions 19 are disposed on both sides of a trench gate structure to be described later, and the contact layers 20 are provided on an opposite side of the trench gate structure across the source regions 19. In the present embodiment, the source regions 19 correspond to a second impurity region.

The base region 18 has a p-type impurity concentration of boron or the like of, for example, $5.0 \times 10^{16}/cm^3$ to $2.0 \times 10^{19}/cm^3$ and a thickness of about 2.0 µm. The source regions 19 have an n-type impurity concentration (that is, surface concentration) of nitrogen, phosphorus, or the like in the surface layer portion, for example, of $1.0 \times 10^{21}/cm^3$, and a thickness of about 0.3 µm. The contact layers 20 have a p-type impurity concentration (that is, surface concentration) of boron or the like in the surface layer portion of, for example, $1.0 \times 10^{21}/cm^3$, and a thickness of about 0.3 µm.

The trench 21 having a width of, for example, 1.4 µm to 2.0 µm is formed so as to penetrate through the base region 18 and the source regions 19 to reach the second current dispersion layer 15 and to locate a bottom surface of the trench 21 in the second current dispersion layer 15. The trench 21 is formed so as not to reach the first current dispersion layer 13 and the first deep layers 14. The trench 21 is formed in the manner that the first current dispersion layer 13 and the first deep layers 14 are located below the bottom surface of the trench 21. Since the trench 21 is formed so as to penetrate through the base region 18 and the source regions 19, it is conceivable that the base region 18 and the source regions 19 are formed so as to be in contact with the side surfaces of the trench 21.

The trench 21 is filled with a gate insulation film 22 formed on an inner wall surface of the trench 21 and a gate electrode 23 made of doped polysilicon formed on a surface of the gate insulation film 22. As a result, a trench gate structure is formed. Although not particularly limited, the gate insulation film 22 is formed by thermally oxidizing the inner wall surface of the trench 21, and has a thickness of about 100 nm on both side surfaces and a bottom surface of the trench 21.

The gate electrodes 23 at the main cell region Rm and the sense cell region Rs is connected to a gate liner 23a forming from the outer portion of the trench 21 at both ends of the trench structure, as illustrated in FIG. 4. As illustrated by hatching in FIG. 1C, the gate liner 23a is formed so as to surround the periphery of the sense cell region Rs, and is formed so as to reach the main cell region Rm across the element isolation portion In described later. Although only partially illustrated in the drawing, the gate liner 23a is also formed so as to surround the main cell region Rm.

In the present embodiment, the trench gate structure is configured in this manner. The trench 21 extends in the y-axis direction in FIG. 1A (that is, a <11-20> direction) as the longitudinal direction. In the present embodiment, the trench 21 extends in the <11-20> direction, thereby being capable of inhibiting a facet surface from being formed on a (1-100) plane which is a side wall surface of the trench 21. In addition, since the (1-100) plane is used as a channel, an influence of channel mobility dependency can be reduced. Actually, the multiple trenches 21 are aligned along the x-axis direction as illustrated in FIG. 1A so as to be shaped in a stripe. The source regions 19 and the contact layers 20 extend along the extension direction of the trench 21 as illustrated in FIG. 1C.

A source electrode 24 and a gate wire (not illustrated) are formed on surfaces of the source regions 19 and the contact layers 20 and a surface of the gate electrode 23. In the present embodiment, the source electrode 24 corresponds to a first electrode.

The source electrode 24 and the gate wire are made of multiple metals (for example, Ni/Al) and at least portions that are in contact with the n-type SiC (that is, the source regions 19 and the gate electrode 23 in the case of n-doping) are made of a metal capable of coming in an ohmic contact with the n-type SiC. In the source electrode 24 and the gate wire, at least portions that are in contact with the p-type SiC (that is, the contact layers 20 and the gate electrode 23 in the case of p-doping) are made of a metal capable of coming in an ohmic contact with p-type SiC.

The source electrode 24 and the gate wire are electrically insulated from each other by being separated on the interlayer insulating film 25. The source electrode 24 is electrically connected to the source regions 19 and the contact layers 20 through a contact hole 25a provided in the interlayer insulating film 25. As a result, the first deep layers 14 is maintained at the same potential as that of the source electrode 24 through the contact layers 20, the base region 18, and the second deep layers 17. The gate wire is electrically connected to the gate electrode 23 through the contact hole provided in the interlayer insulating film 25 in a cross section different from that of FIGS. 2 to 4.

A drain electrode 26 electrically connected to the substrate 11 is formed on a rear surface side of the substrate 11. In the present embodiment, the substrate 11 functions as a drain layer. In the present embodiment, the drain electrode 26 corresponds to a second electrode.

As described above, the SiC semiconductor device is configured such that the vertical MOSFETs having an inverted trench gate structure are arranged in the main cell region Rm and the sense cell region Rs. As illustrated in FIG. 1B, the source electrode 24 is separated into a main source electrode 24a in the main cell region Rm and a sense source electrode 24b in the sense cell region Rs. The main source electrode 24a and the sense source electrode 24b respectively perform external electrical connections separately.

The sense source electrode 24b performs an external electrical connection through a lead-out wiring 24c disposed inside a slit 24d formed at the main source electrode 24a.

The element isolation portion In is included between the main cell region Rm and the sense cell region Rs. The main cell region Rm and the sense cell region Rs are provided with such a vertical MOSFET. The element isolation portion In performs electrical isolation between the main cell region Rm and the sense cell region Rs.

The element isolation portion In is formed to surround the sense cell region Rs, and the element isolation structure is formed by a trench gate structure similar to the main cell region Rm and the sense cell region Rs.

As illustrated in FIG. 4, the element isolation portion In also includes the substrate 11, n⁻-type layer 12, the first current dispersion layer 13, the first deep layer 14, the second current dispersion layer 15, the second deep layer 17 and the base region 18.

More specifically, although the element isolation portion In does not include the source region 19, the base region 19 at the element isolation In is electrically connected to the sense cell electrode 24b or the main cell electrode 24a through a contact at a portion not illustrated. The structures of other parts are substantially the same as the vertical MOSFETs in the main cell region Rm and the sense cell region Rs. That is, the impurity concentration and thickness of each part provided in the element isolation portion In are equal to those of each part provided in the cell region. The first deep layer 14 is arranged so as to be located on both sides of the trench gate structure, and is connected to the second deep layer 17 on both sides of the trench gate structure.

The first deep layers 14 located on both sides of the trench gate structure are arranged at a spacing interval B3. This spacing interval B3 is shorter than the spacing interval B4 between the second deep layers 17 at the element isolation portion In, and the first deep layer 14 protrudes toward the trench gate structure side from the second deep layer 17. The spacing interval B3 between the first deep layers 14 at the element isolation portion In is set to be shorter than or equal to the spacing interval B1 between the first deep layers 14 at the cell region, in a situation where the impurity concentrations of the first current dispersion layer 13 and the first deep layer 14 are identical at the element isolation portion In and the cell region.

The trench gate structure of the element isolation portion In is similar to the trench gate structure of the vertical MOSFET included in the cell region that has the gate electrode 23 in the trench 21 through the gate insulation film 22. The gate electrode 23 extends not only inside the trench 21 but also outside the trench 21, so that the cross-sectional shape where the longitudinal direction of the trench 21 is regarded as a normal line is configured as a T-shape as illustrated in FIG. 4. It is electrically connected to the gate electrodes 23 at the main cell region Rm and the sense cell region Rs through a portion extended to an external part of the trench 21. Since the trench gate structure is formed so as to surround the sense cell region Rs, it is laid out in a polygonal shape, for example, a quadrangular shape or a quadrilateral shape in this example. Each corner portion serving as a boundary position of each side constituting the polygonal shape is rounded in an arc shape. The sides included in the trench gate structure includes two sides extending in the x-axis direction and two sides extending in the y-axis direction.

In the present embodiment, the width of the trench 21 at the element isolation In is set to be equal to the width of the trench 21 at the cell region, and the respective widths of the trench gate structures at the element isolation portion In and the cell region are the same. The trench gate structure functions as a field plate structure. Even when a higher voltage is applied to the drain electrode 26 in a situation where the gate electrode 23 has the same potential as the base region 18, the withstand voltage of the element isolation portion In can be attained.

The configuration of the SiC semiconductor device according to the present embodiment is described above. Next, the operation of the SiC semiconductor device will be described.

First, in the SiC semiconductor device, an inversion layer is not formed in the base region 18 in an off-state before a gate voltage is applied to the gate electrode 23. For that reason, even if a positive voltage (for example, 1600 V) is applied to the drain electrode 26, electrons do not flow from the source regions 19 into the base region 18, and no current flows between the source electrode 24 and the drain electrode 26.

In addition, in a state before a gate voltage is applied to the gate electrode 23, an electric field is applied between the drain and the gate, and an electric field concentration may occur at a bottom of the gate insulation film 22. However, in the SiC semiconductor device, the first deep layers 14 and the first current dispersion layer 13 are provided at positions deeper than the trench 21. For that reason, a depletion layer formed between the first deep layers 14 and the first current dispersion layer 13 suppresses the rising of equipotential lines due to an influence of the drain voltage, and makes a high electric field difficult to enter the gate insulation film. Therefore, in the present embodiment, breakdown of the gate insulation film 22 can be inhibited.

When a predetermined gate voltage (for example, 20 V) is applied to the gate electrode 23, a channel is provided in the surface of the base region 18 which is in contact with the trench 21. For that reason, the electrons injected from the source electrode 24 pass through the channel extended to the base region 18 from the source regions 19, and then flow into the second current dispersion layer 15. The electrons flowing through the second current dispersion layer 15 pass through the first current dispersion layer 13 to the $n^-$-type layer 12, and then pass through the substrate 11 as a drain layer to the drain electrodes 26. As a result, a current flows between the source electrode 24 and the drain electrode 26, and the SiC semiconductor device is turned on. In the present embodiment, since the electrons having passed through the channels pass through the second current dispersion layer 15, the first current dispersion layer 13, and the $n^-$-type layer 12 to flow to the substrate 11, it is conceivable that the drift layer 16 includes the second current dispersion layer 15, the first current dispersion layer 13, and the $n^-$-type layer 12.

At that time, a reverse bias is applied between the first deep layers 14 and the second deep layers 17, and the first current dispersion layer 13 and the second current dispersion layer 15, so that the depletion layer extends. In a situation where the n-type impurity concentration of the first current dispersion layer 13 and the second current dispersion layer 15 is set to be higher than that of the $n^-$-type layer 12, it is possible to inhibit the spread of the depletion layer extended from the first deep layer 14 as compared with a situation where the n-type impurity concentration of the first current dispersion layer 13 and the second current dispersion layer 15 is set to be equal to that of the $n^-$-type layer 12. For that reason, the narrowing of the current path is inhibited, and the on-resistance can be reduced.

In the present embodiment, the trench gate structure is also included in the element isolation portion In to isolate the elements. The trench gate structure functions as a field plate structure. Even when a higher voltage is applied to the drain electrode 26 in a situation where the gate electrode 23 has the same potential as the base region 18, the withstand voltage of the element isolation portion In can be attained.

The spacing interval B3 between the first deep layers 14 at the element isolation portion In is set to be equal to or shorter than the spacing interval B1 between the first deep layers 14 at the cell region. Therefore, it is possible to set the withstand voltage of the element isolation portion In to be larger than or equal to the withstand voltage of the main cell region Rm. At the time of breakdown, it is possible that the main cell region Rm firstly have a breakdown or the element isolation portion In and the main cell region Rm have a breakdown simultaneously without a situation where the element isolation portion In firstly have a breakdown. It is possible to inhibit the generation of breakdown firstly at the element isolation portion In with a smaller area. It is also possible to inhibit element breakdown caused by the inflow of the avalanche current at the sense cell region Rs.

The operation of the SiC semiconductor device according to the present embodiment is described above. The following describes the particular impurity concentration and width of the first current dispersion layer 13 at the cell region, which includes the main cell region Rm and the sense cell region Rs, and the element isolation portion In.

First, the impurity concentration and width of the first current dispersion layer 13 at the cell region are set based on the following.

Figure 5:
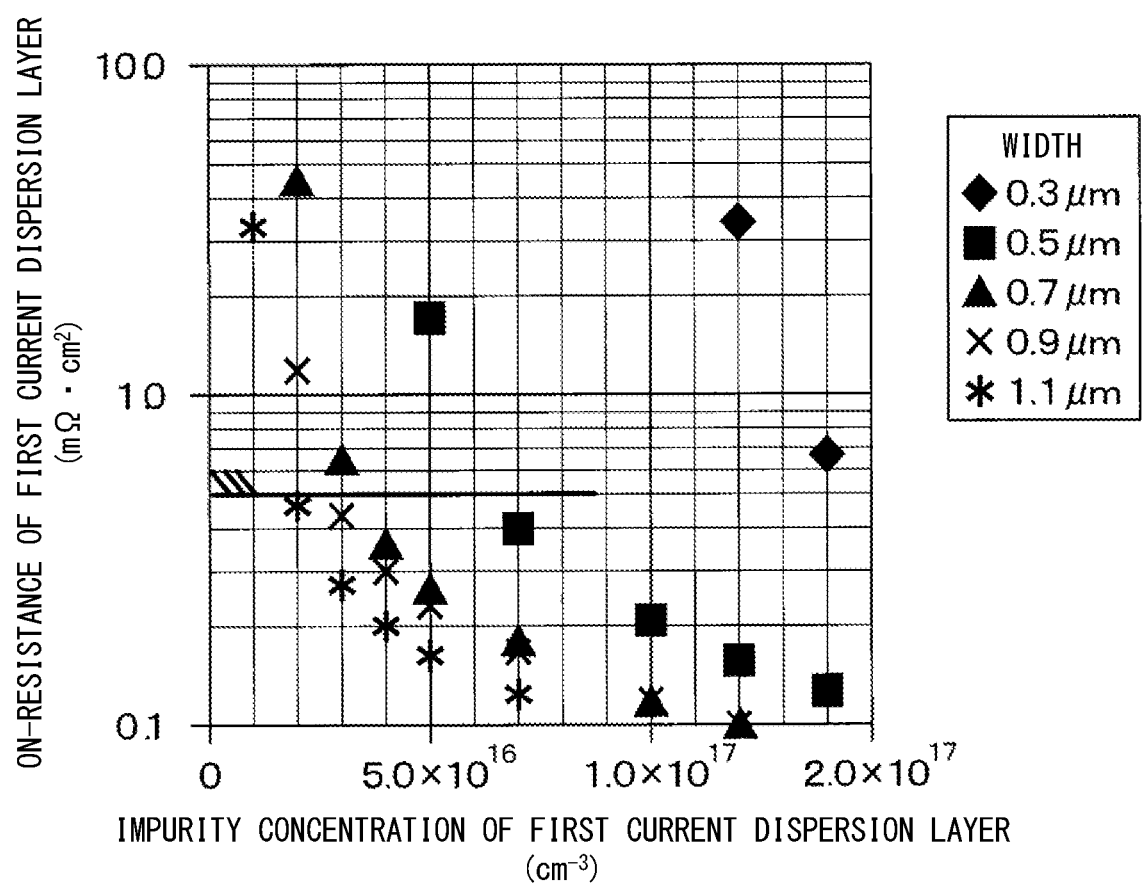
FIG. 5 illustrates a simulation result of the relation among an impurity concentration, a width of a first current dispersion layer, and an on-resistance of the first current dispersion layer.

As illustrated in FIG. 5, the on-resistance of the first current dispersion layer 13 decreases as the impurity concentration of the first current dispersion layer 13 increases. More specifically, the on-resistance of the first current dispersion layer 13 sharply decreases as the impurity concentration increases in a range of 0.5 $m\Omega\cdot cm^2$ or more, and gradually decreases as the impurity concentration increases in a range of less than 0.5 $m\Omega\cdot cm^2$. The on-resistance also depends on the width of the first current dispersion layer 13, and becomes lower as the width of the first current dispersion layer 13 becomes wider. For that reason, in the present embodiment, the impurity concentration and widths of the first current dispersion layers 13 are set so that the on-resistance is less than 0.5 $m\Omega\cdot cm^2$.

Figure 6:
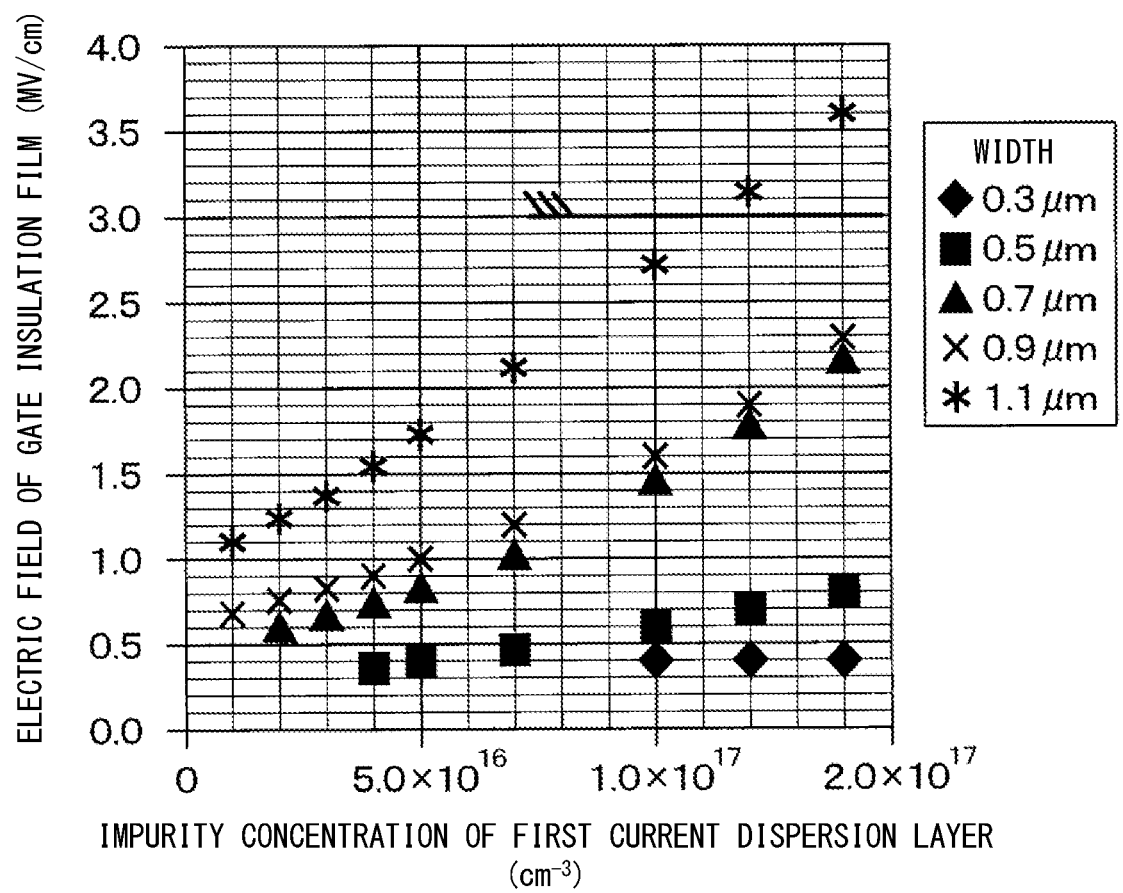
FIG. 6 illustrates simulation results of the relation among the impurity concentration, the width of the first current dispersion layer, an electric field applied to a gate insulation film.

Next, as illustrated in FIG. 6, an electric field to be applied to the gate insulation film 22 at the time of OFF increases as the impurity concentration of the first current dispersion layer 13 increases, and increases as the width of the first current dispersion layer 13 increases. In this example, in the SiC semiconductor device having the trench gate structure as in the present embodiment, if the electric field applied to the gate insulation film 22 is less than 3.0 MV/cm, the SiC semiconductor device is generally highly reliable. Therefore, in the present embodiment, the impurity concentration and width of the first current dispersion layers 13 are set so that the electric field applied to the gate insulation film 22 is less than 3.0 MV/cm.

Figure 7:
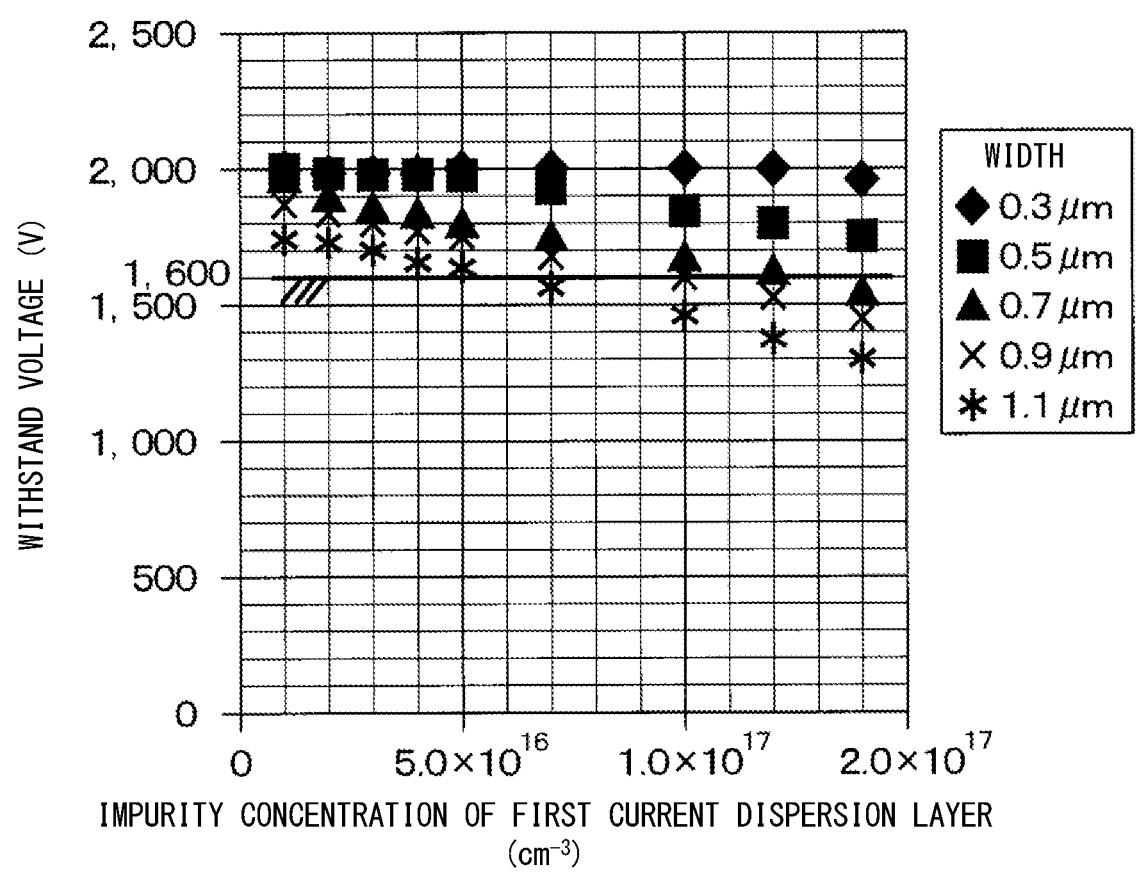
FIG. 7 illustrates simulation results of the relation between impurity concentration and the width of the first current dispersion layer and a withstand voltage.

Further, as illustrated in FIG. 7, a withstand voltage becomes lower as the impurity concentration of the first current dispersion layer 13 becomes higher, and becomes lower as the width of the first current dispersion layer 13 becomes wider. In this example, in the SiC semiconductor device having the trench gate structure as in the present embodiment, the withstand voltage of 2000 V is theoretically maximized at present, and the withstand voltage is sufficiently high if the withstand voltage is 1600 V. For that reason, in the present embodiment, the impurity concentration and the width of the first current dispersion layer 13 are set so that the withstand voltage becomes 1600 V or more.

Figure 8:
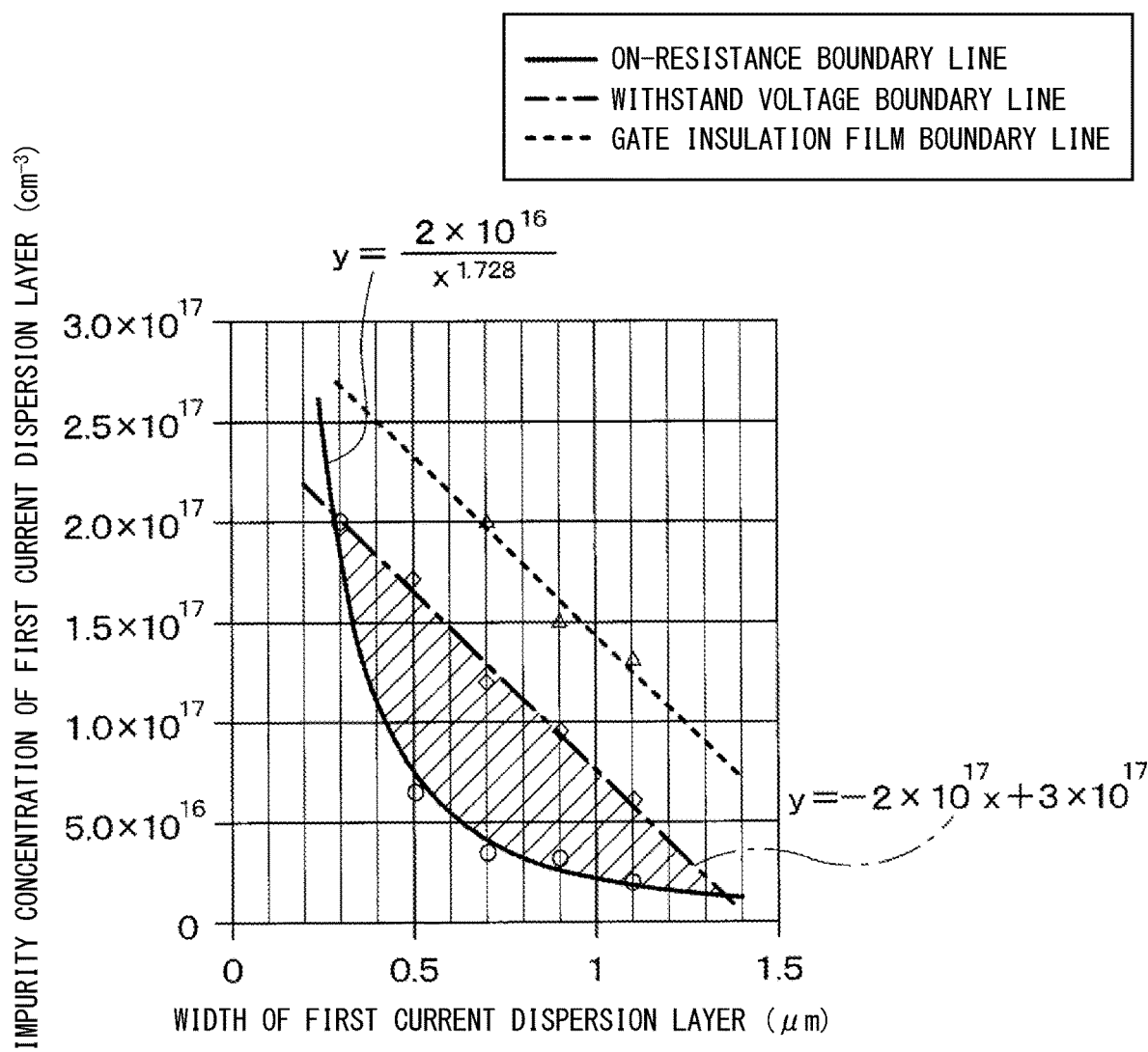
FIG. 8 illustrates the results of the relation among an on-resistance, an electric field applied to the gate insulation film, a withstand voltage, and an impurity concentration and the width of the first current dispersion layer.

FIGS. 5 to 7 are summarized as illustrated in FIG. 8. Specifically, in FIG. 8, a hatched portion is a region that satisfies all of the on-resistance of the first current dispersion layer 13 of FIG. 5, the electric field applied to the gate insulation film 22 of FIG. 6, and the withstand voltage of FIG. 7.

For that reason, in the present embodiment, when the impurity concentration of the first current dispersion layer 13 in the cell region is defined as y [cm$^{-3}$] and the width of the first current dispersion layer 13 is defined as x [μm], a relationship of $2\times10^{16}/x^{1.728} < y < -2\times10^{17}x + 3\times10^{17}$ is satisfied. As a result, in the present embodiment, the electric field applied to the gate insulation film 22 can be reduced while the on-resistance is reduced, and a decrease in the withstand voltage can be also inhibited. In the present embodiment, since each of the multiple first deep layers 14 extends along the x-axis direction, the width of the first current dispersion layer 13 corresponds to a length of the narrowest portion of the first current dispersion layer 13.

Since the spacing interval B1 corresponding to the impurity concentration y [cm$^{-3}$] and the width x [μm] of the first current dispersion layer 13 at the cell region as described above, the spacing interval B3 corresponding to the impurity concentration and the width of the first current dispersion layer 13 at the element isolation portion In is set based on these conditions. In the present embodiment, the impurity concentration of the first current dispersion layer 13 at the element isolation portion In is set to be equal to the impurity concentration y [cm$^{-3}$] of the first current dispersion layer 13 in the cell region. The spacing interval B3 is set to be shorter than or equal to the width x [μm] corresponding to the spacing interval B1.

Therefore, it is possible to satisfy the withstand voltage conditions for the vertical MOSFET at the cell region and further design the element isolation portion In to have a withstand voltage or higher than the withstand voltage at the cell region. At the time of breakdown, it is possible that the main cell region Rm firstly have a breakdown or the element isolation portion In and the main cell region Rm have a breakdown simultaneously without a situation where the element isolation portion In have a breakdown earlier than the main cell region Rm. It is possible to inhibit the generation of breakdown firstly at the element isolation portion In with a smaller area. It is also possible to inhibit element breakdown caused by the inflow of the avalanche current at the sense cell region Rs.

Next, a method for manufacturing the SiC semiconductor device according to the present embodiment will be described with reference to FIGS. 9A to 9J and FIGS. 10A to 10J. FIGS. 9A to 9J are cross-sectional views corresponding to FIG. 3, and FIGS. 10A to 10J are cross-sectional views corresponding to FIG. 4.

Figure 9A:
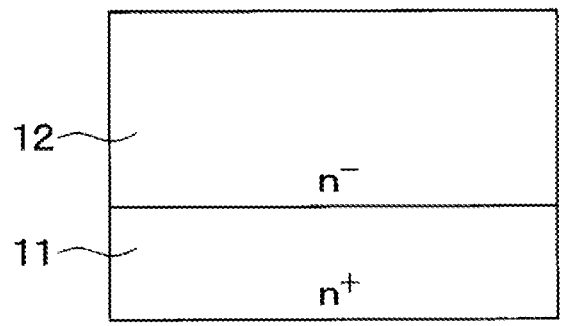
FIG. 9A illustrates a manufacturing process of a SiC semiconductor device according to the second embodiment, and is a cross-sectional view showing a portion corresponding to FIG. 3.
Figure 10A:
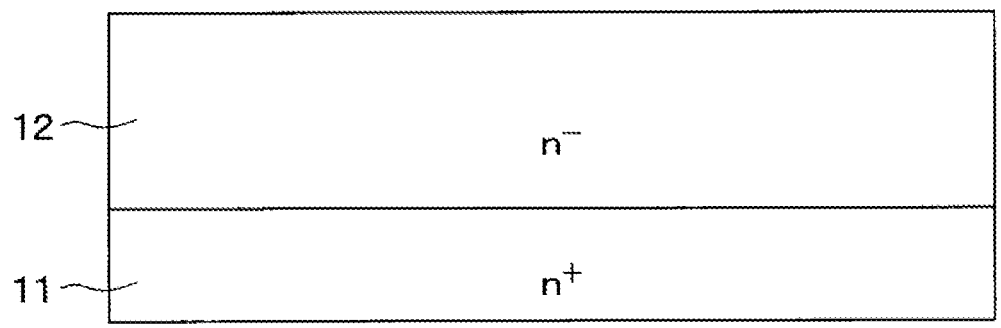
FIG. 10A illustrates a manufacturing process of a SiC semiconductor device according to the first embodiment, and is a cross-sectional view showing a portion corresponding to FIG. 4.

First, as illustrated in FIG. 9A and 10A, the n$^+$-type substrate 11 is prepared. Then, the n$^-$-type layer 12 made of SiC is epitaxially grown on the surface of the substrate 11.

Figure 9B:
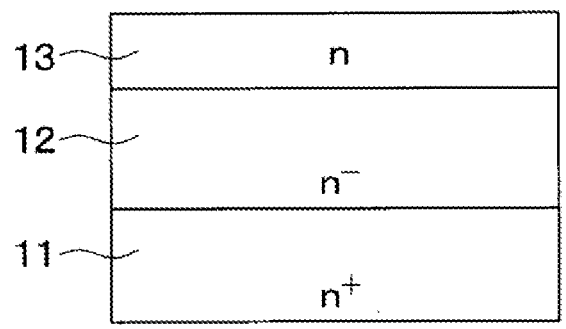
FIG. 9B is a cross-sectional view showing a manufacturing process of the SiC semiconductor device continued from FIG. 9A.
Figure 10B:
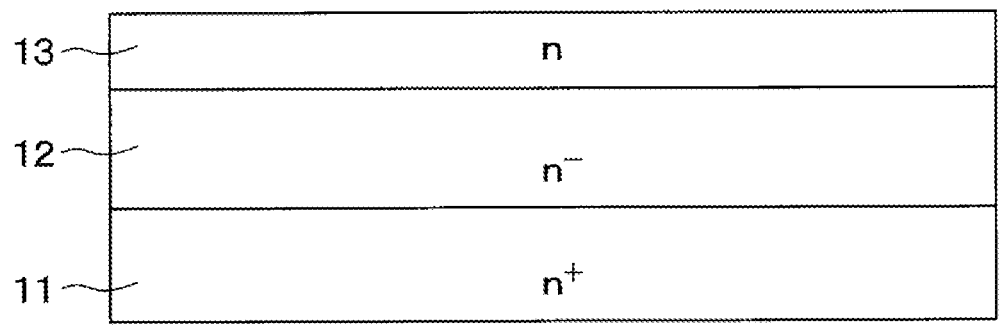
FIG. 10B is a cross-sectional view showing a manufacturing process of the SiC semiconductor device continued from FIG. 10A.

Next, as illustrated in FIG. 9B and FIG. 10B, a mask (not illustrated) is formed on the surface of the n$^-$-type layer 12, and the mask is patterned by photolithography or the like so that a region in which the first current dispersion layer 13 is to be formed is opened. In particular, the mask is patterned so that only the cell region, which includes the main cell Rm and the sense cell region Rs, and the element isolation portion In are opened and the outer withstand voltage region is covered. Then, an n-type impurity such as nitrogen or phosphorus is ion-implanted from above the mask and subjected to a thermal treatment to form the first current dispersion layer 13. Thereafter, the mask is removed. As the mask, for example, an LTO (that is, Low Temperature Oxide) film or the like is used. In the present embodiment, although a mask is used also in a process to be described later, for example, an LTO film or the like is used as each mask.

In the present embodiment, the first current dispersion layer 13 is formed by ion implantation. For that reason, as compared with the case in which the first current dispersion layer 13 is formed of an epitaxial film, the impurity concentration of the first current dispersion layer 13 can be easily controlled, and variations in characteristics can be inhibited. It is also possible to form the first current dispersion layer 13 with an epitaxial film.

Figure 9C:
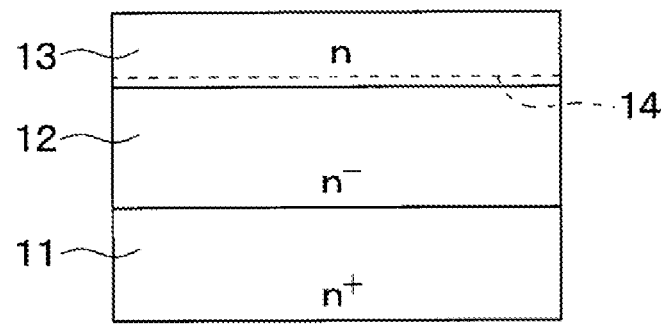
FIG. 9C is a cross-sectional view showing a manufacturing process of the SiC semiconductor device continued from FIG. 9B.
Figure 10C:
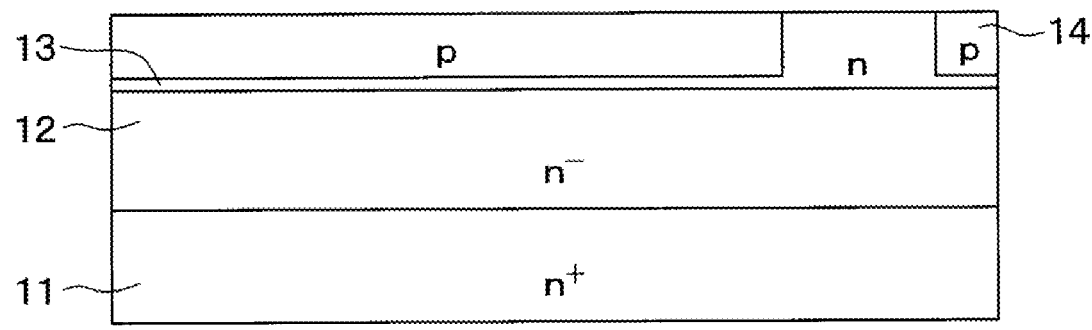
FIG. 10C is a cross-sectional view showing a manufacturing process of the SiC semiconductor device continued from FIG. 10B.

Next, as illustrated in FIG. 9C and FIG. 10C, a mask (not illustrated) is formed, and the mask is patterned by photolithography or the like so that regions in which the first deep layer 14 is to be formed are opened at the cell region and the element isolation portion In. Then, p-type impurities such as boron are ion-implanted from above the mask and subjected to a thermal treatment to form the first deep layers 14.

As described above, the first deep layers 14 have a stripe shape and are formed shallower than the first current dispersion layer 13. As described above, the first current dispersion layer 13 and the first deep layers 14 are formed so as to satisfy $2\times10^{16}/x^{1.728} < y < -2\times10^{17}x + 3\times10^{17}$. The spacing interval B3 between the first deep layers 14 at the element isolation portion In is shorter than or equal to the spacing interval B1 between the first deep layers 14 at the cell region.

Figure 9D:
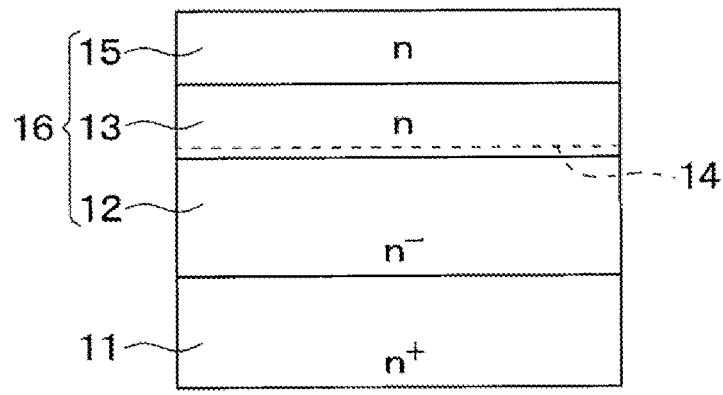
FIG. 9D is a cross-sectional view showing a manufacturing process of the SiC semiconductor device continued from FIG. 9C.
Figure 10D:
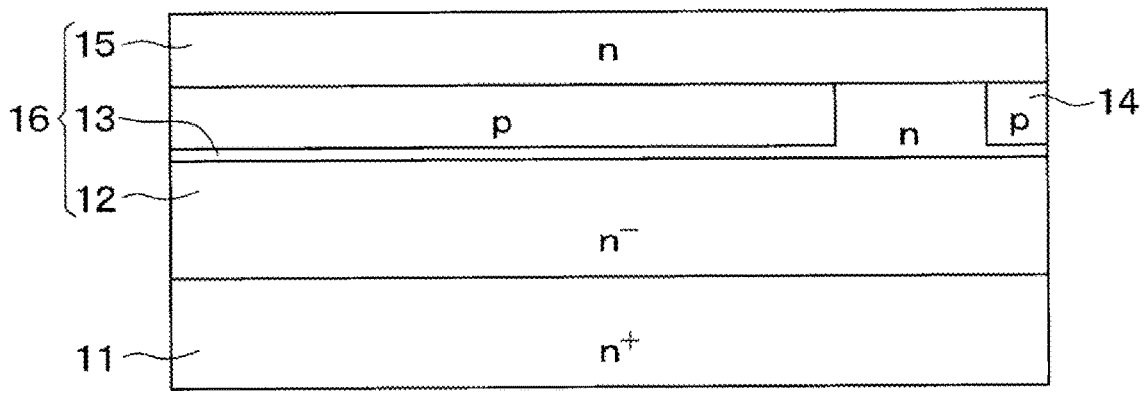
FIG. 10D is a cross-sectional view showing a manufacturing process of the SiC semiconductor device continued from FIG. 10C.

Subsequently, as illustrated in FIG. 9D and FIG. 10D, the second current dispersion layer 15 made of SiC is epitaxially grown on the n$^-$-type layer 12. As a result, the drift layer 16 having the n$^-$-type layer 12, the first current dispersion layer 13, and the second current dispersion layer 15 is formed.

Figure 9E:
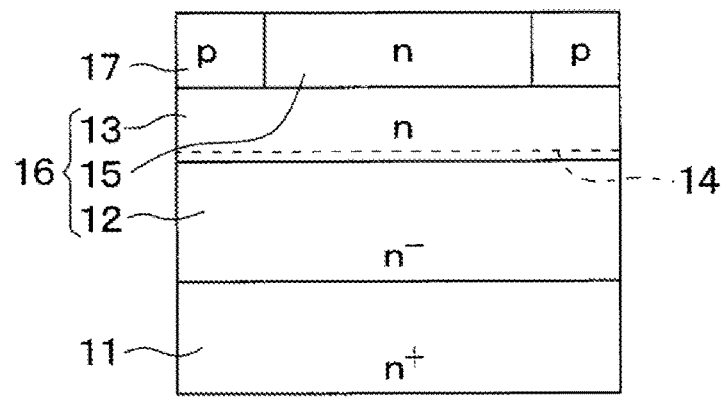
FIG. 9E is a cross-sectional view showing a manufacturing process of the SiC semiconductor device continued from FIG. 9D.
Figure 10E:
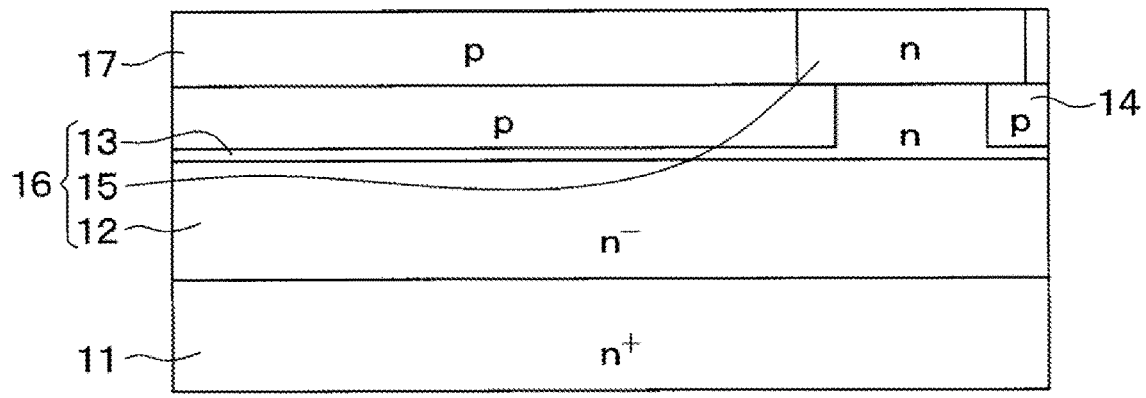
FIG. 10E is a cross-sectional view showing a manufacturing process of the SiC semiconductor device continued from FIG. 10D.

Next, as illustrated in FIG. 9E and FIG. 10E, a mask (not illustrated) is formed, and the mask is patterned by photolithography or the like so that regions where the second deep layers 17 are to be formed are opened. Then, p-type impurities such as boron are ion-implanted from above the mask and subjected to a thermal treatment to form the second deep layers 17.

At this time, the second deep layers 17 are extended in a direction intersecting with the extension direction of the first deep layers 14. For that reason, even if there is some positional deviation in forming the second deep layers 17, a situation that the first deep layers 14 and the second deep layers 17 are not connected to each other can be inhibited from occurring.

Figure 9F:
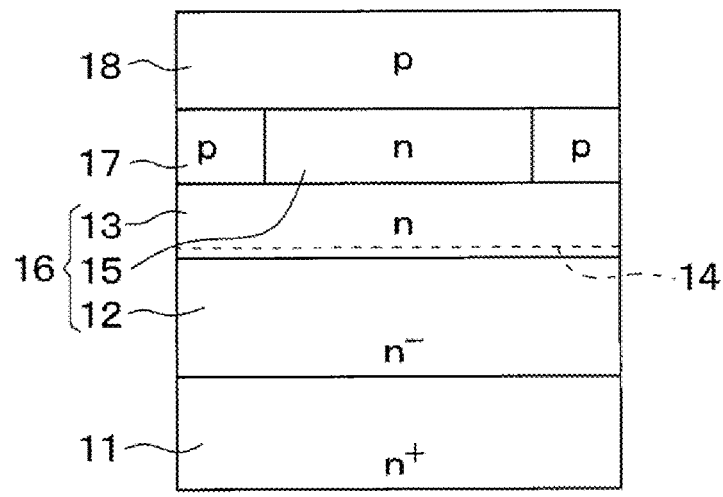
FIG. 9F is a cross-sectional view showing a manufacturing process of the SiC semiconductor device continued from FIG. 9E.
Figure 10F:
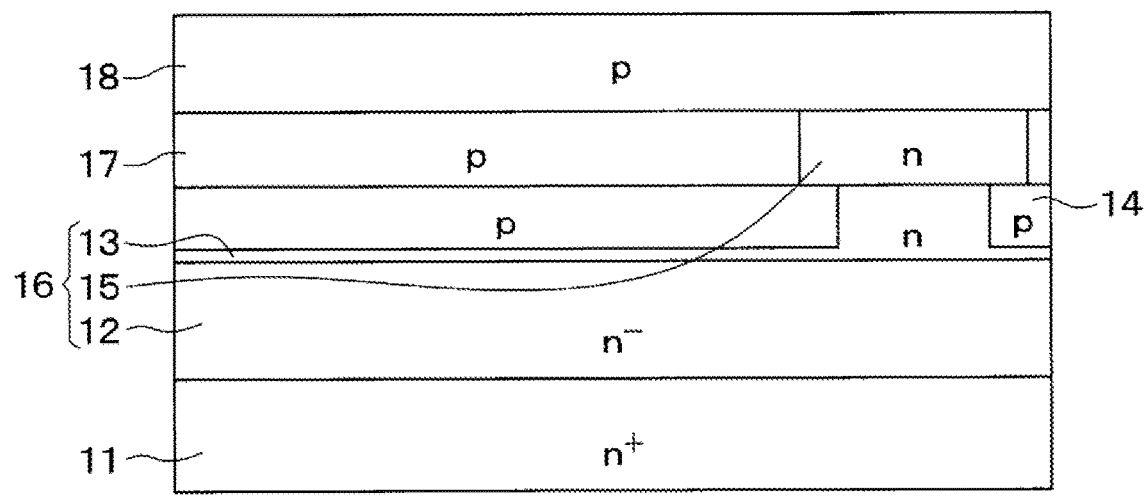
FIG. 10F is a cross-sectional view showing a manufacturing process of the SiC semiconductor device continued from FIG. 10E.

Next, as illustrated in FIG. 9F and FIG. 10F, a p-type impurity layer is epitaxially grown on the second current dispersion layer 15 and the second deep layers 17 to form the base region 18.

Figure 9G:
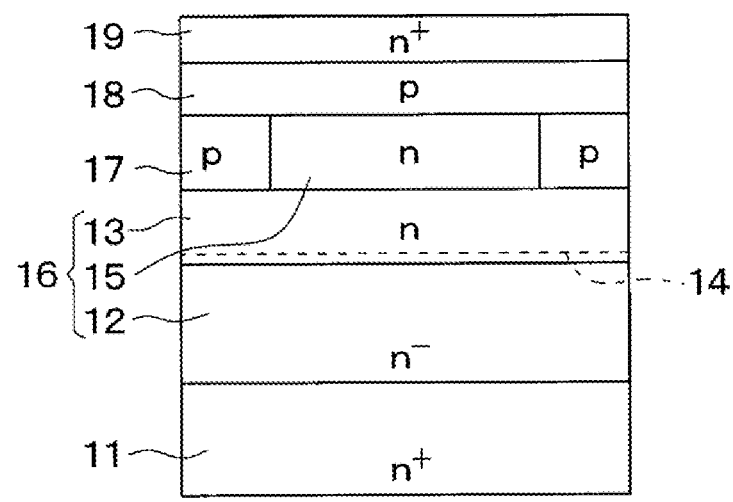
FIG. 9G is a cross-sectional view showing a manufacturing process of the SiC semiconductor device continued from FIG. 9F.
Figure 10G:
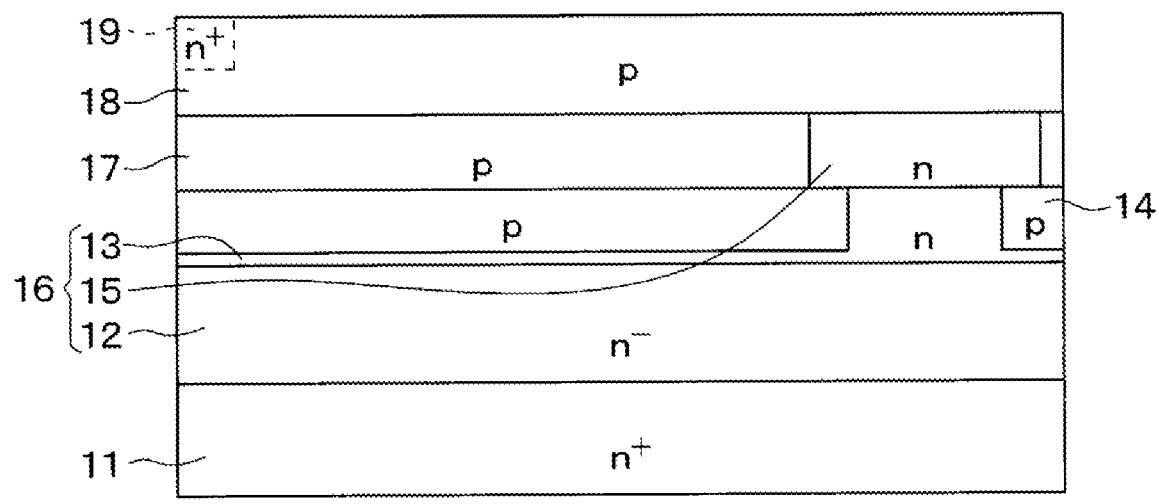
FIG. 10G is a cross-sectional view showing a manufacturing process of the SiC semiconductor device continued from FIG. 10F.

Then, a mask (not illustrated) is formed on the base region 18 as illustrated in FIGS. 9G and 10G, and the mask is patterned by photolithography or the like so that regions in which the source regions 19 are to be formed are opened. Then, an n-type impurity such as nitrogen is ion-implanted from above the mask and subjected to a thermal treatment to form the source region 19. Therefore, it is possible to form the source region 19 at the main cell region Rm and the sense cell region Rs and prevent the formation of source region 19 at the element isolation portion In.

Figure 9H:
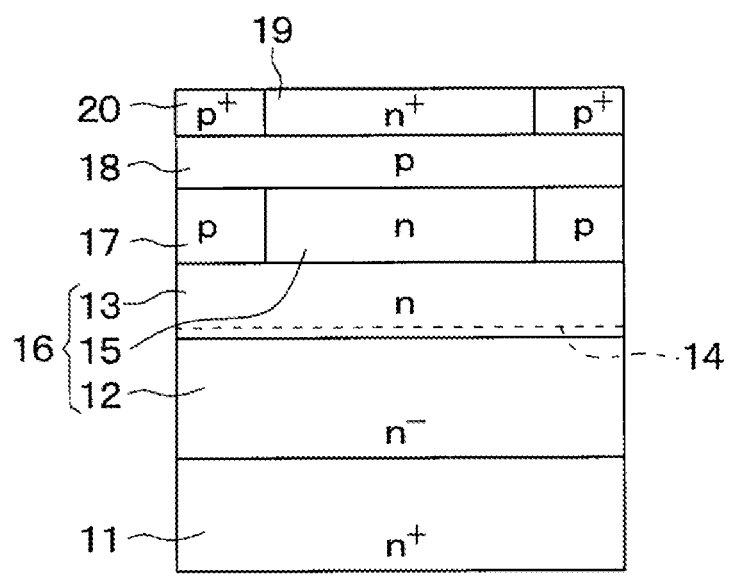
FIG. 9H is a cross-sectional view showing a manufacturing process of the SiC semiconductor device continued from FIG. 9G.
Figure 10H:
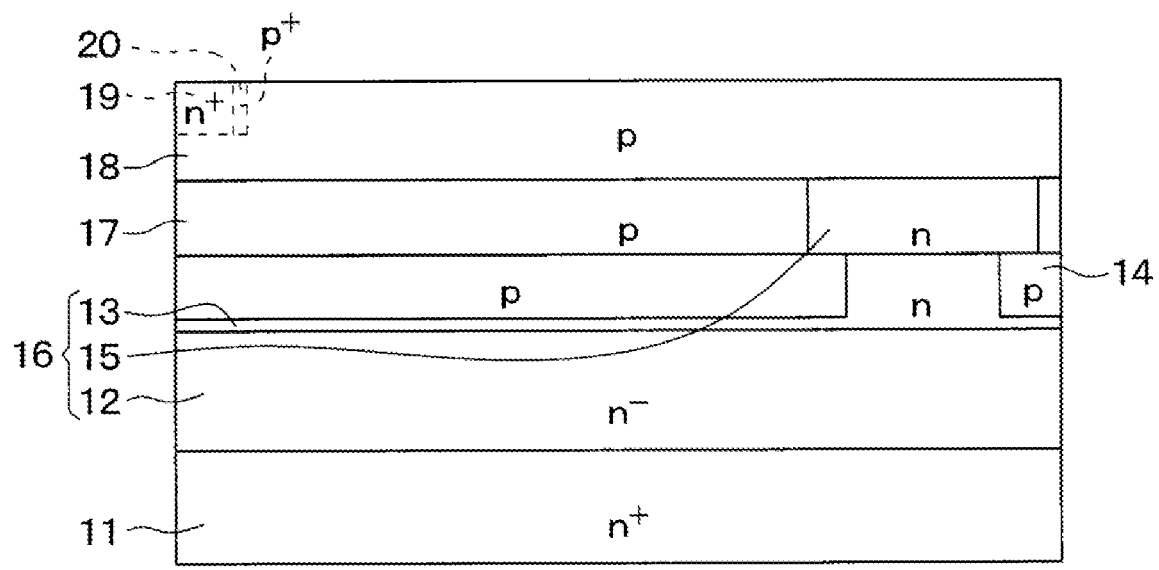
FIG. 10H is a cross-sectional view showing a manufacturing process of the SiC semiconductor device continued from FIG. 10G.

Then, a mask (not illustrated) is formed as illustrated in FIGS. 9H and 10H, and the mask is patterned by photolithography or the like so that regions in which the contact layers 20 are to be formed are opened. Then, p-type impurities such as boron are ion-implanted from above the mask and subjected to a thermal treatment to form the contact layers 20.

Figure 9I:
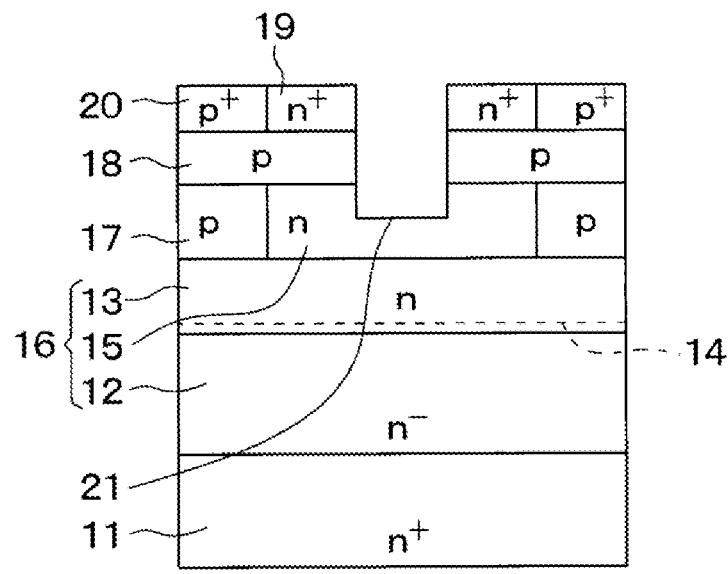
FIG. 9I is a cross-sectional view showing a manufacturing process of the SiC semiconductor device continued from FIG. 9H.
Figure 10I:
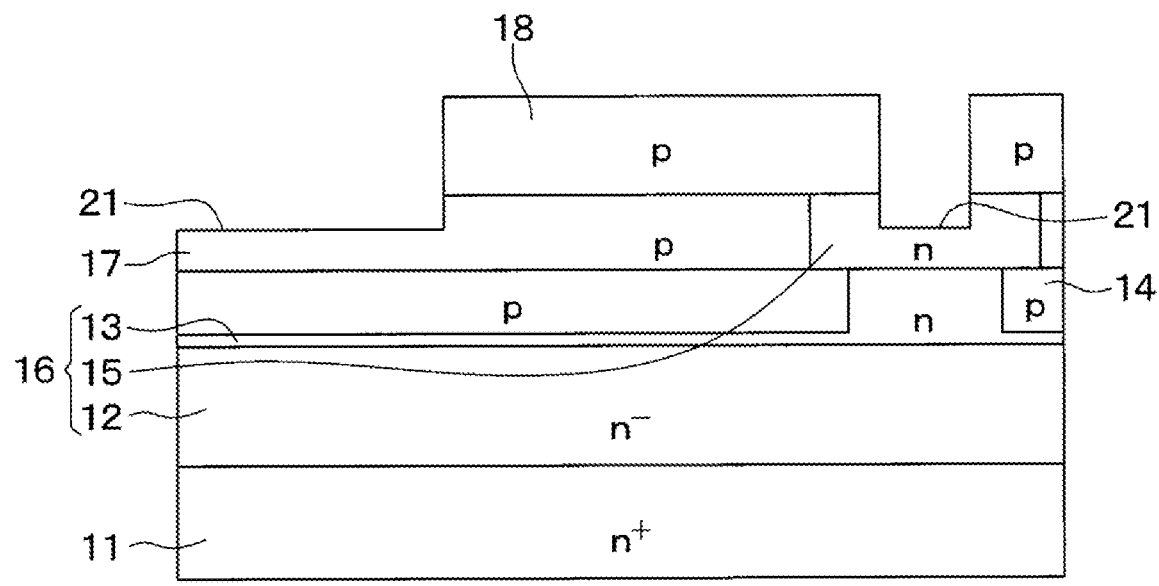
FIG. 10I is a cross-sectional view showing a manufacturing process of the SiC semiconductor device continued from FIG. 10H.

Next, as illustrated in the FIGS. 9I and 10I, a mask (not illustrated) is formed, and then the mask is patterned so that the region where the trench 21 is formed is opened. Then, anisotropic etching is performed to form the trench 21. After anisotropic etching, isotropic etching or sacrificial layer oxidation may be performed as necessary. More specifically, the trench 21 is formed so as to penetrate through the source regions 19 and the base region 18 and so that the bottom of the trench 21 is located in the second current dispersion layer 15 in the main cell region Rm and the sense cell region Rs. In other words, the trench 21 is formed so that the first current dispersion layer 13 and the first deep layers 14 are located below the bottom surface of the trench 21. In the element isolation portion In, the trench 21 is formed so as to penetrate through the base region 18 and so that the bottom of the trench 21 is located in the second current dispersion layer 15.

The trench 21 may form up to the bottom part of the second current dispersion layer 15. In this situation, the bottom part of the trench 21 is in contact with the first current dispersion layer 13 and the first deep layer 14. In such a structure, the bottom part of the trench 21 comes into contact with a ion-implantation part where detects may remain, and therefore leak may occur. In view of suppressing leakage, the bottom part of the trench 21 may be disposed inside the second current dispersion layer 15.

Figure 9J:
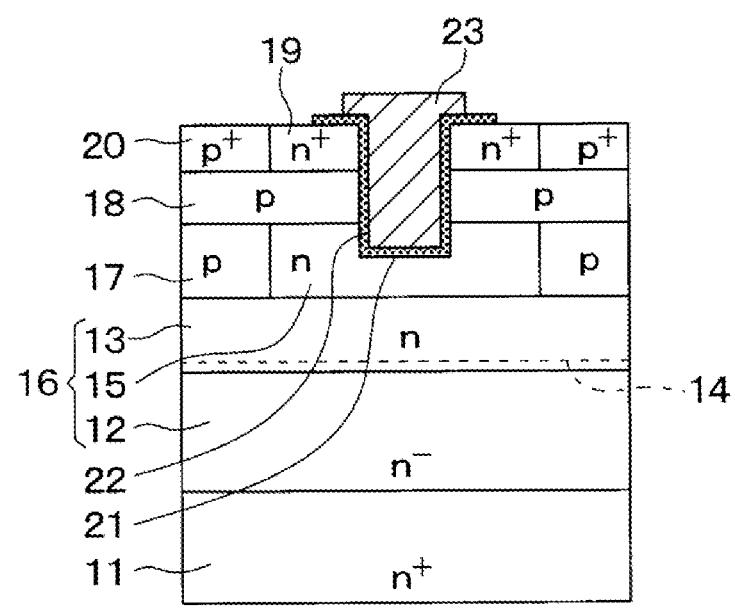
FIG. 9J is a cross-sectional view showing a manufacturing process of the SiC semiconductor device continued from FIG. 9I.
Figure 10J:
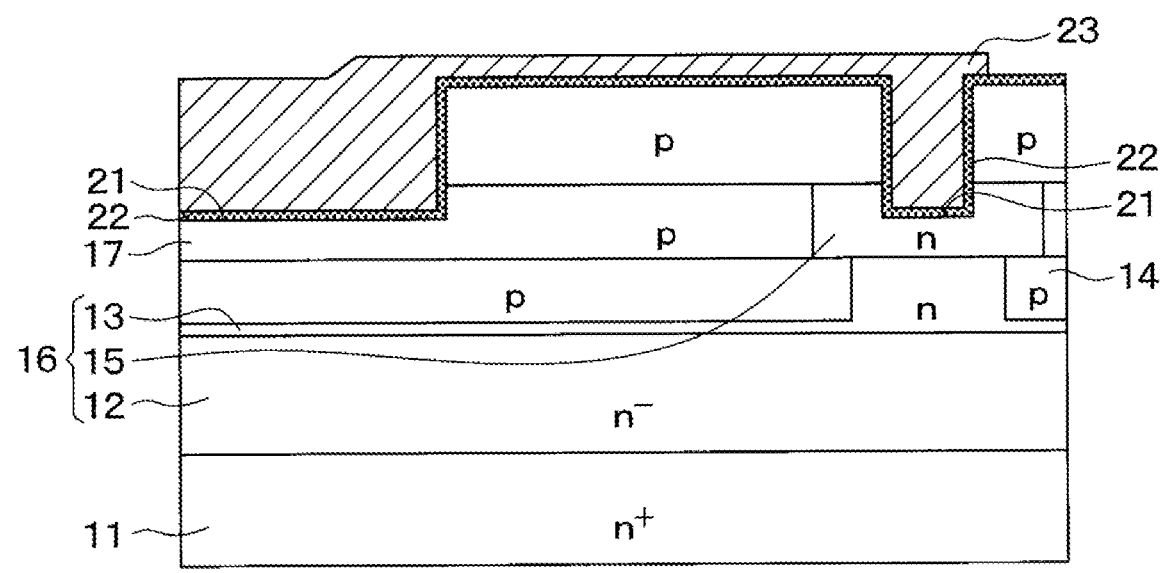
FIG. 10J is a cross-sectional view showing a manufacturing process of the SiC semiconductor device continued from FIG. 10I.

Next, as illustrated in the FIGS. 9J and 10J, the gate insulation film 22 is formed at a location including the inside of the trench 21. Specifically, the gate insulation film 22 is formed by gate oxidation (that is, thermal oxidation) by a pyrogenic method using a wet atmosphere. Subsequently, a polysilicon layer doped with an n-type impurity is formed on the surface of the gate insulation film 22 to a thickness of about 440 nm at a temperature of, for example, 600° C., and then an etch-back process or the like is performed so that the gate insulation film 22 and the gate electrode 23 remain in the trench 21. As a result, a trench gate structure is formed.

The subsequent steps are the same as those in the related art, and therefore are not illustrated in the figure, but briefly described, first, the interlayer insulating film 25 is formed. Then, the contact hole 25a from which a part of the source regions 19 and the contact layers 20 are exposed and a contact hole from which a part of the gate electrode 23 is exposed are formed. Next, an electrode material is formed so as to fill each contact hole 25a, and then the electrode material is patterned to form the source electrode 24 and the gate wire. The drain electrode 26 is formed on the rear surface side of the substrate 11. As described above, the SiC semiconductor device according to the present embodiment is manufactured.

As described above, in the present embodiment, the first current dispersion layer 13 having an impurity concentration higher than that of the $n^-$-type layer 12 and the first deep layers 14 formed in the first current dispersion layer 13 are provided at positions deeper than the trench 21. For that reason, a high electric field hardly enters the gate insulation film 22, and breakdown of the gate insulation film 22 can be inhibited.

The trench gate structure is also included in the element isolation portion In to isolate the elements. The trench gate structure functions as a field plate structure. Even when a higher voltage is applied to the drain electrode 26 in a situation where the gate electrode 23 has the same potential as the base region 18, the withstand voltage of the element isolation portion In can be attained.

The spacing interval B3 between the first deep layers 14 at the element isolation portion In is set to be equal to or shorter than the spacing interval B1 between the first deep layers 14 at the cell region. Therefore, it is possible to set the withstand voltage of the element isolation portion In to be larger than or equal to the withstand voltage of the main cell region Rm. At the time of breakdown, it is possible that the main cell region Rm firstly have a breakdown or the element isolation portion In and the main cell region Rm have a breakdown simultaneously without a situation where the element isolation portion In firstly have a breakdown. It is possible to inhibit the generation of breakdown firstly at the element isolation portion In with a smaller area. It is also possible to inhibit element breakdown caused by the inflow of the avalanche current at the sense cell region Rs.

In a situation where the n-type impurity concentration of the first current dispersion layer 13 is set to be higher than that of the $n^-$-type layer 12, it is possible to inhibit the spread of the depletion layer extended from the first deep layer 14 as compared with a situation where the n-type impurity concentration of the first current dispersion layer 13 is set to be equal to that of the $n^-$-type layer 12. For that reason, the narrowing of the current path is inhibited, and the on-resistance can be reduced.

Further, the first current dispersion layer 13 and the first deep layers 14 are formed at positions deeper than the trench 21. For that reason, even if an alignment deviation or the like occurs when the first deep layers 14 is formed, the first deep layers 14 and the trench 21 can be inhibited from coming into contact with each other.

The first deep layers 14 is formed in the first current dispersion layer 13. In other words, the first deep layers 14 are formed so that the first current dispersion layer 13 is positioned between the bottoms of the first deep layers 14 and the $n^-$-type layer 12. For that reason, the depletion layer extending from the first deep layers 14 greatly extends toward the $n^-$-type layer 12, and the on-resistance can be inhibited from increasing.

Further, the second deep layers 17 extends in a direction intersecting with the extension direction of the first deep layers 14. For that reason, as compared with the case where the second deep layers 17 are extended along the extension direction of the first deep layers 14, a situation that the second deep layers 17 and the first deep layers 14 are not connected to each other when a positional deviation or the like occurs can be inhibited from occurring. In other words, a situation that the first deep layers 14 are in a floating state can be inhibited from occurring.

The second deep layers 17 mainly functions to connect the first deep layers 14 and the base region 18 (that is, the source electrode 24) and are formed at positions away from the trench 21. For that reason, as compared with the case where the second deep layers 17 are in contact with the trench 21, when electrons that have passed through a channel provided in the base region 18 flow into the second current dispersion layer 15, the path that flows into the second current dispersion layer 15 can be inhibited from becoming narrower. This makes it possible to inhibit an increase in the on-resistance.

In a situation where the n-type impurity concentration of the second current dispersion layer 15 is set to be higher than that of the $n^-$-type layer 12, it is possible to inhibit the spread of the depletion layer extended from the second deep layer 17 as compared with a situation where the n-type impurity concentration of the second current dispersion layer 15 is set to be equal to that of the $n^-$-type layer 12. In other words, the current path in the first current dispersion layer 13 can be inhibited from narrowing. This makes it possible to inhibit an increase in the on-resistance.

The first current dispersion layer 13 and the first deep layers 14 are formed to have an impurity concentration of y [cm$^{-3}$] in the first current dispersion layer 13 and a width of x [μm] in the first current dispersion layer 13 so as to satisfy a relationship of $2\times10^{16}/x^{1.728} < y < -2\times10^{17}x + 3\times10^{17}$. This makes it possible to reduce the electric field applied to the gate insulation film 22 while reducing the on-resistance, and makes it also possible to inhibit a decrease in the withstand voltage.

Modification of First Embodiment (1) In the first embodiment, the impurity concentration of the first current dispersion layer 13 in the main cell region Rm and the sense cell region Rs is set to be equal to the impurity concentration of the first current dispersion layer 13 at the element isolation portion In. However, the impurity concentration of the first current dispersion layer 13 at the element isolation portion In may be set to be lower than the impurity concentration of the main cell region Rm and the sense cell region Rs. According to the above configuration, the width of the depletion layer formed at the first current dispersion layer 13 in the element isolation portion In is wider than the depletion layer formed at the first current dispersion layer 13 in the main cell region Rm and the sense cell region Rs. Therefore, the element isolation portion In has a higher withstand voltage than the main cell region. It is possible to prevent the element isolation portion from having a breakdown first.

In a situation where the impurity concentration of the first current dispersion layer 13 at the element isolation portion In is set to be lower than the impurity concentration of the first current dispersion layer 13 at the main cell region Rm and the sense cell region Rs, it is required to modify the formation method of the first current dispersion layer 13 with respect to the first embodiment. For example, in a situation where the first current dispersion layer 13 is formed, the first current dispersion layer 13 is firstly formed with the impurity concentration of the first current dispersion layer 13 at the element isolation portion In, and subsequently increases the impurity concentration up to the impurity concentration of the first current dispersion layer 13 at the cell region with ion implantation of n-type impurity by using the mask. Therefore, it is possible to lower the impurity concentration of the first current dispersion layer 13 at the element isolation portion In as compared with the impurity concentration of the first current dispersion layer 13 at the main cell region Rm and the sense cell region Rs.

(2) In the first embodiment, the impurity concentration of the second current dispersion layer 15 at the main cell region Rm and the sense cell region Rs is set to be equal to the impurity concentration of the second current dispersion layer 15 at the element isolation portion In. However, the impurity concentration of the second current dispersion layer 15 at the element isolation portion In may be set to be lower than the impurity concentration of the main cell region Rm and the sense cell region Rs. According to the above configuration, the width of the depletion layer formed at the second current dispersion layer 15 in the element isolation portion In is wider than the depletion layer formed at the second current dispersion layer 15 in the main cell region Rm and the sense cell region Rs. Therefore, the element isolation portion In has a higher withstand voltage than the main cell region. It is possible to prevent the element isolation portion from having a breakdown first.

In a situation where the impurity concentration of the second current dispersion layer 15 at the element isolation portion In is set to be lower than the impurity concentration of the second current dispersion layer 15 at the main cell region Rm and the sense cell region Rs, it is required to modify the formation method of the second current dispersion layer 15 with respect to the first embodiment. For example, in a situation where the second current dispersion layer 15 is formed, the second current dispersion layer 15 is firstly formed with the impurity concentration of the second current dispersion layer 15 at the element isolation portion In, and subsequently increases the impurity concentration up to the impurity concentration of the second current dispersion layer 15 at the cell region with ion implantation of n-type impurity by using the mask. Therefore, it is possible to lower the impurity concentration of the second current dispersion layer 15 at the element isolation portion In as compared with the impurity concentration of the second current dispersion layer 15 at the main cell region Rm and the sense cell region Rs.

(3) In the first embodiment, the spacing interval B2 between the second deep layers 17 at the main cell region Rm and the sense cell region Rs is set to be equal to the spacing interval B4 between the second deep layers 17 at the element isolation portion In. However, it is possible to shorten the spacing interval B4 between the second deep layers 17 at the element isolation portion In as compared with the spacing interval B2 between the second deep layers 17 at the main cell region Rm and the sense cell region Rs. According to the above configuration, it is difficult for the equipotential lines to enter the second current dispersion layer 15 side at the element isolation portion In with respect to the cell region. Therefore, the element isolation portion In has a higher withstand voltage than the main cell region. It is possible to prevent the element isolation portion In from having a breakdown first.

In order to shorten the spacing interval B4 between the second deep layers 17 at the element isolation portion In as compared with the spacing interval B2 between the second deep layers 17 at the main cell region Rm and the sense cell region Rs, it may be possible to only modify the mask for ion implantation when forming the second deep layers 17.

(4) In the first embodiment, the width of the trench gate structure at the main cell region Rm and the sense cell region Rs is set to be equal to the width of the trench gate structure at the element isolation portion In. On the other hand, the width of trench gate structure at the element isolation portion In may be set to be narrower than the width of the trench gate structure at the cell region, and the depth of the trench gate structure at the element isolation portion In may be set to be shallower than the depth of the trench gate structure at the cell region.

Due to the microloading effect during etching of the trench 21, the depth of the trench gate structure depends on the width of the trench gate structure, in other words, the width of the trench 21. As the width of the trench gate structure is narrower, the depth of the trench gate structure becomes shallower. On the other hand, the width of trench 21 at the element isolation portion In may be set to be narrower than the width of the trench 21 at the cell region, and the depth of the trench gate structure at the element isolation portion In may be set to be shallower than the depth of the trench gate structure at the cell region.

According to the configuration, the distance from the bottom part of the first deep layer 14 to the bottom part of the trench gate structure is longer in the element isolation portion In as compared with the cell region. Even when the equipotential lines rise, it is difficult for the equipotential lines to reach the trench gate structure. Therefore, the element isolation portion In has a higher withstand voltage than the main cell region. It is possible to prevent the element isolation portion from having a breakdown first.

Second Embodiment

The following describes a second embodiment. The second embodiment is different from the first embodiment in the modification of the structure of vertical MOSFET and the structure of element isolation portion In at the cell region, and the other features of the second embodiment are the same as those in the first embodiment, so that the description will be omitted here.

Figure 11:
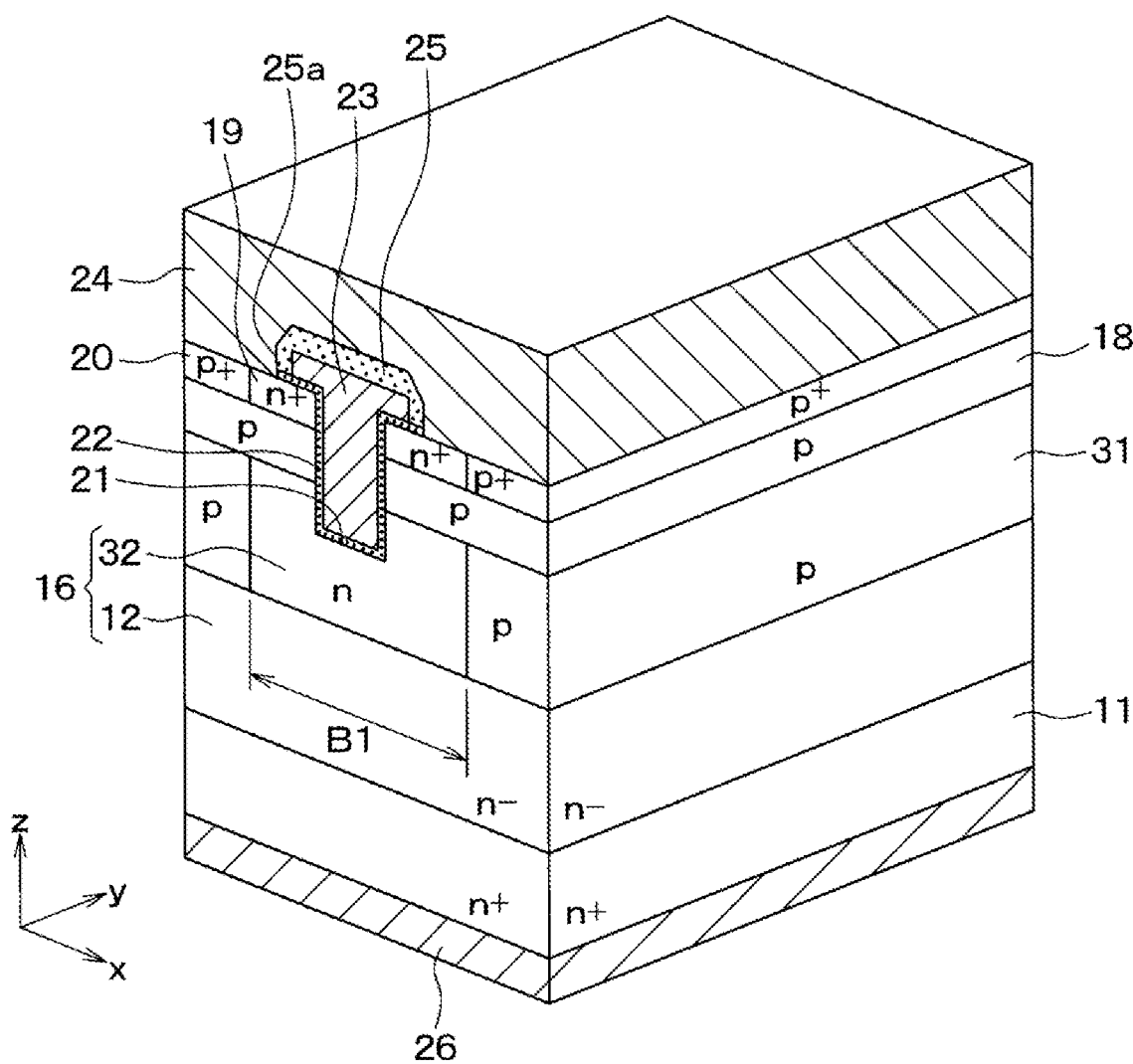
FIG. 11 is a cross-sectional perspective view of a SiC semiconductor device according to a second embodiment.
Figure 12A:
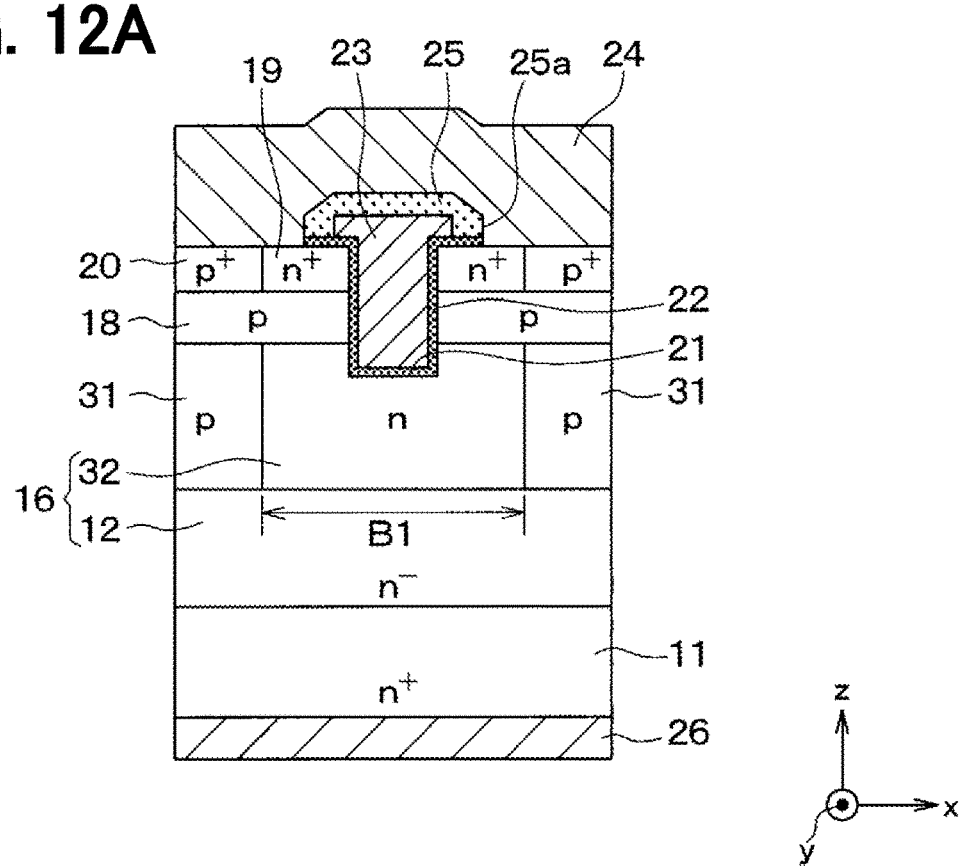
FIG. 12A is a cross-sectional view of a MOSFET at a main cell region and a sense cell region.
Figure 12B:
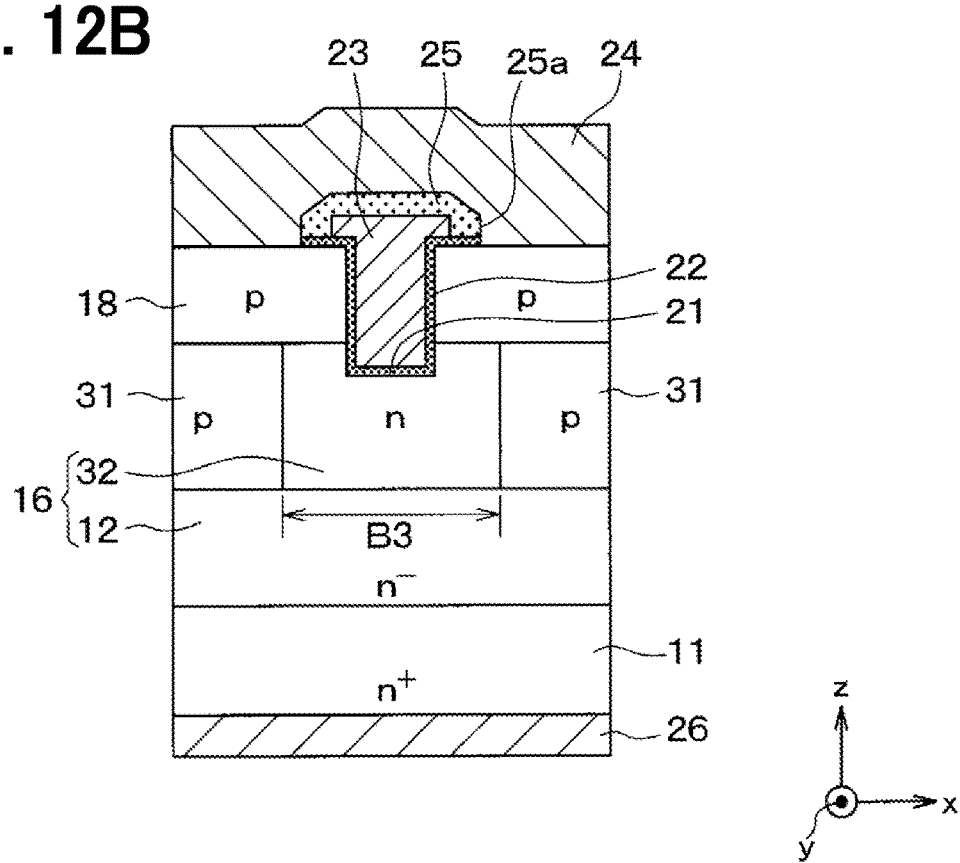
FIG. 12B is a cross-sectional view of an element isolation portion.

As illustrated in FIGS. 11, 12A and 12B, in the present embodiment, the first deep layer 14 and the second deep layer 17, which are described in the first embodiment, are combined into an one deep layer 31 at both of the cell region and the element isolation portion In. Similarly, the first current dispersion layer 13 and the second current dispersion layer 15 are combined into one current dispersion layer 32.

Therefore, it is also possible to form the deep layer 31 as a single layer and the current dispersion layer 32 as a single layer disposed between the deep layers 31. In such a structure, although the spacing interval between the deep layers 31 is set to prevent the equipotential lines from entering when a higher voltage is applied to the drain electrode 26, it is also required to ensure the spacing interval between the deep layer 31 and the trench gate structure. Therefore, it is possible to attain a desirable withstand voltage since the rise of the equipotential lines can be inhibited by the deep layer 31, even though a higher withstand voltage cannot be attained as compared with the first embodiment.

Even with such a structure, the spacing interval B3 between the deep layers 31 at the element isolation portion In is set to be shorter than or equal to the spacing interval B1 between the deep layers 31 at the cell region having the main cell region Rm and the sense cell region Rs. Therefore, it is possible to set the withstand voltage of the element isolation portion In to be larger than or equal to the withstand voltage of the main cell region Rm. At the time of breakdown, it is possible that the main cell region Rm firstly have a breakdown or the element isolation portion In and the main cell region Rm have a breakdown simultaneously without a situation where the element isolation portion In firstly have a breakdown. The advantageous effects similar to the first embodiment can be attained.

The method for manufacturing the SiC semiconductor device of the present embodiment is almost the same as the first embodiment. That is, the SiC semiconductor device of the present embodiment may be manufactured by adopting the manufacturing method that eliminates the steps illustrated in FIGS. 9B, 9C, 10B, and 10C described in the first embodiment. In the steps illustrated in FIGS. 9D, 9E, 10D and 10E, a step for forming the deep layer 31 is in replacement of the step for forming the second deep layer 17, and a step for forming the current dispersion layer 32 is in replacement of the step for forming the second current dispersion layer 15. At the time of ion implantation when forming the deep layer 31, the ion implantation with higher energy is performed so that the p-type impurities are implanted to a deeper position.

Modification of Second Embodiment (1) In the second embodiment, the impurity concentration of the current dispersion layer 32 in the main cell region Rm and the sense cell region Rs is set to be equal to the impurity concentration of the current dispersion layer 32 at the element isolation portion In. However, the impurity concentration of the current dispersion layer 32 at the element isolation portion In may be set to be lower than the impurity concentration of the current dispersion layer 32 at the main cell region Rm and the sense cell region Rs. According to the above configuration, the width of the depletion layer formed at the current dispersion layer 32 in the element isolation portion In is wider than the depletion layer formed at the current dispersion layer 32 in the main cell region Rm and the sense cell region Rs. Therefore, the element isolation portion In has a higher withstand voltage than the main cell region. It is possible to prevent the element isolation portion from having a breakdown first.

In a situation where the impurity concentration of the current dispersion layer 32 at the element isolation portion In is set to be lower than the impurity concentration of the current dispersion layer 32 at the main cell region Rm and the sense cell region Rs, it is required to modify the formation method of the current dispersion layer 32 at each region with respect to the first embodiment. For example, in a situation where the current dispersion layer 32 is formed, the current dispersion layer 32 is firstly formed with the impurity concentration of the current dispersion layer 32 at the element isolation portion In, and subsequently increases the impurity concentration up to the impurity concentration of the second current dispersion layer 15 at the cell region with ion implantation of n-type impurity by using the mask. Therefore, it is possible to lower the impurity concentration of the current dispersion layer 32 at the element isolation portion In as compared with the impurity concentration of the current dispersion layer 32 at the main cell region Rm and the sense cell region Rs.

(2) Even in the second embodiment, the width of trench gate structure at the element isolation portion In may be set to be narrower than the width of the trench gate structure at the cell region, and the depth of the trench gate structure at the element isolation portion In may be set to be shallower than the depth of the trench gate structure at the cell region. Accordingly, the distance from the bottom part of the first deep layer 14 to the bottom part of the trench gate structure is longer in the element isolation portion In as compared with the cell region. Even when the equipotential lines rise, it is difficult for the equipotential lines to reach the trench gate structure. Therefore, the element isolation portion In has a higher withstand voltage than the main cell region. It is possible to prevent the element isolation portion from having a breakdown first.

Third Embodiment

The following describes a third embodiment. The third embodiment is different from the first embodiment in the modification of the structure of vertical MOSFET at the cell region, and the other features are the same as those in the first embodiment, so that the description will be omitted here.

Figure 13:
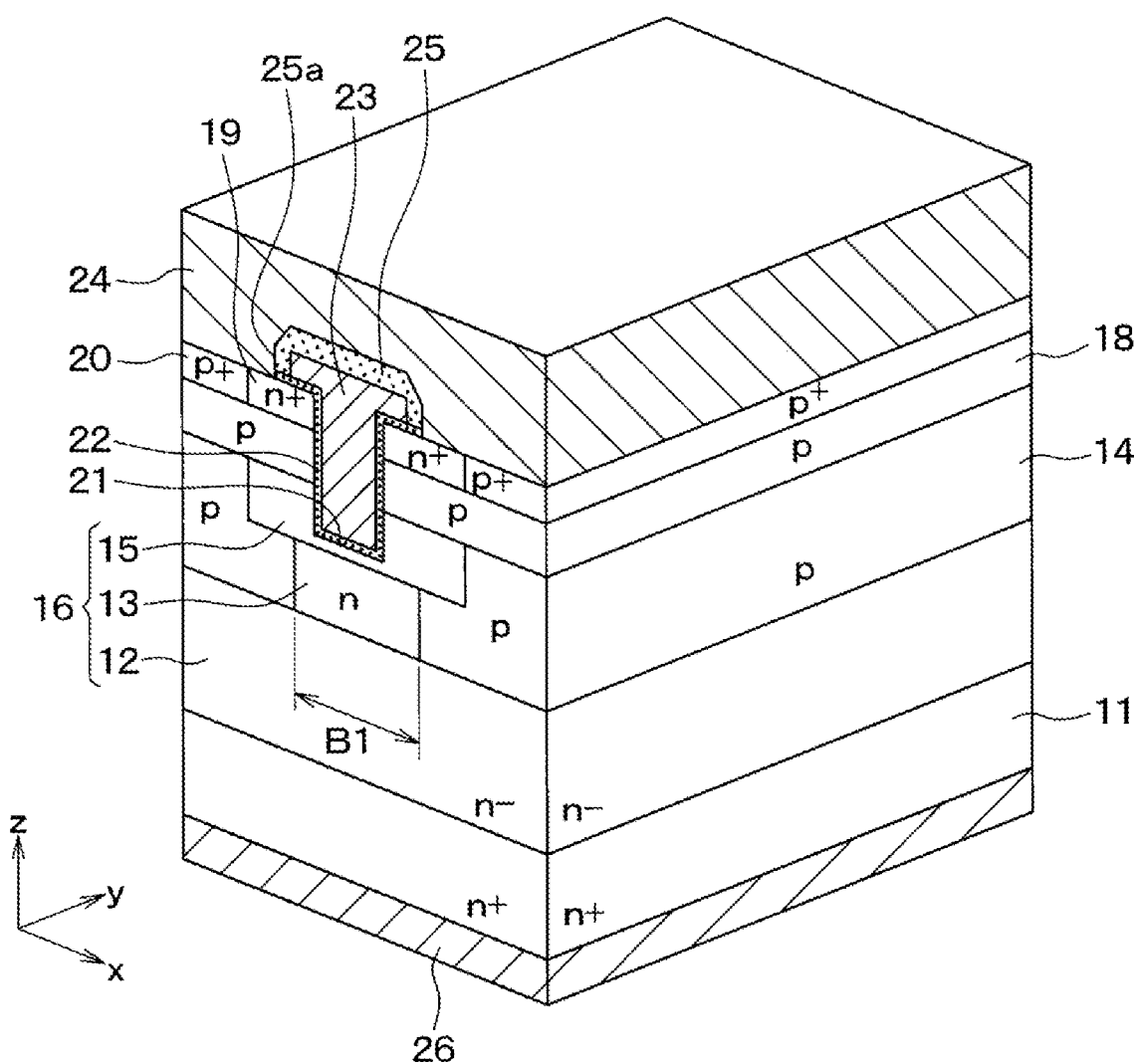
FIG. 13 is a cross-sectional perspective view of a SiC semiconductor device according to a third embodiment.
Figure 14A:
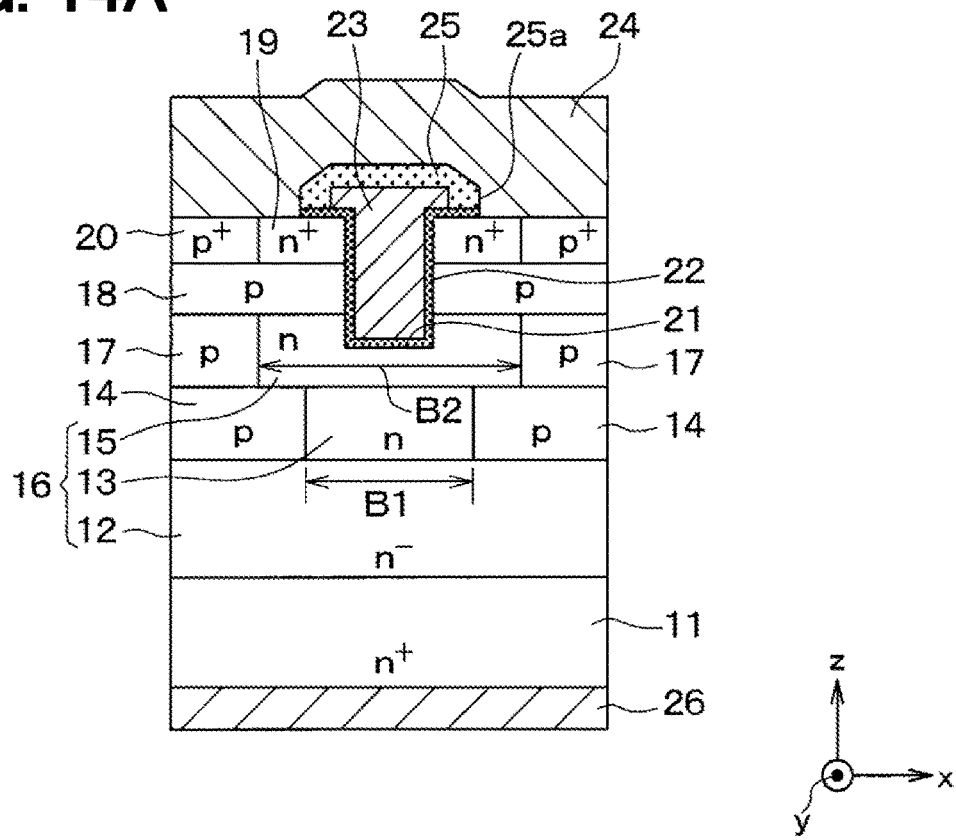
FIG. 14A is a cross-sectional view of a MOSFET at a main cell region and a sense cell region.
Figure 14B:
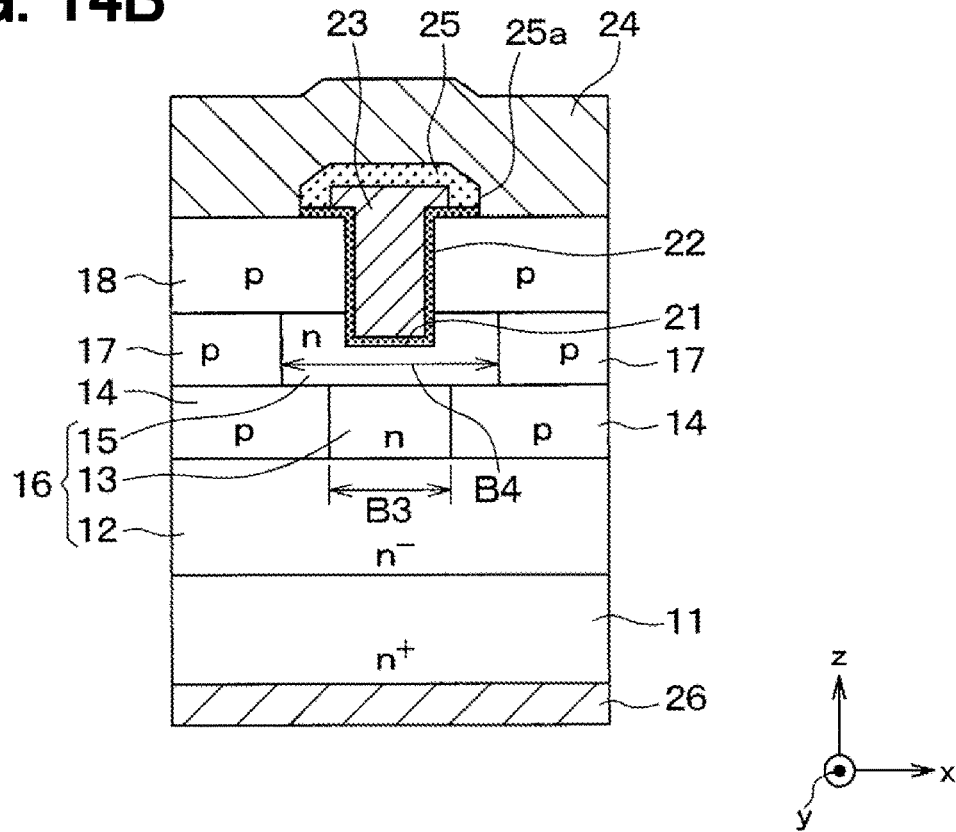
FIG. 14B is a cross-sectional view of an element isolation portion.

As illustrated in FIG. 13, in the present embodiment, the extending direction of the first deep layer 14, which is described in the first embodiment, is modified, and the first deep later 14 extends in a direction identical to the longitudinal direction of the trench gate structure. In particular, as illustrated in FIG. 14A and FIG. 14B, the first deep layer 14 is arranged so as to be located on both sides of the trench gate structure, and is connected to the second deep layer 17 on both sides of the trench gate structure. As illustrated in FIG. 14A and FIG. 14B, in the x-axis direction, the dimension of the first deep layer 14 is larger than the dimension of the second deep layer 17, the first current dispersion layer 13 further protrudes towards the trench gate structure side as compared with the second deep layer 17. In the present embodiment, the distance between the first deep layers 14 in the x-axis direction is defined as the spacing interval B1. The spacing interval B3 between the first deep layers 14 at the element isolation portion In is set to be equal to or shorter than the spacing interval B1 between the first deep layers 14 at the cell region.

Similar to the first deep layer 14 and the first current dispersion layer 13 in the element isolation portion In, the first deep layer 14 and the first current dispersion layer 13 of the vertical MOSFET included in the cell region may also be provided at both sides of the trench gate structure. Even with such a configuration, it is possible to inhibit the equipotential lines from entering the bottom of the trench gate structure when a higher voltage is applied to the drain electrode 26. Thus, it is possible to attain a higher withstand voltage.

Even with such a structure, the spacing interval B3 between the first deep layers 14 at the element isolation portion In is set to be shorter than or equal to the spacing interval B1 between the first deep layers 14 at the cell region having the main cell region Rm and the sense cell region Rs. Therefore, it is possible to set the withstand voltage of the element isolation portion In to be larger than or equal to the withstand voltage of the main cell region Rm. At the time of breakdown, it is possible that the main cell region Rm firstly have a breakdown or the element isolation portion In and the main cell region Rm have a breakdown simultaneously without a situation where the element isolation portion In firstly have a breakdown. The advantageous effects similar to the first embodiment can be attained.

The method for manufacturing the SiC semiconductor device of the present embodiment is almost the same as the first embodiment. In steps illustrated in FIGS. 9C and 10C described in the first embodiment, the pattern of the mask used for ion implantation of p-type impurities may be modified to form the first deep layer 14 with the layout in the present embodiment.

Modification of Third Embodiment

As illustrated in the third embodiment, in the cell region, the first deep layer 14 is disposed at both sides of the trench gate structure, and the first deep layer 14 is connected to the second deep layer 17 at both sides of the trench gate structure. However, the configuration similar to each modification of the first embodiment may also be applied. Any of (1) to (4) described in the modification examples in the first embodiment may also be applied to the configuration of the third embodiment. The similar advantageous effects may also be attained in each of the modification examples.

Fourth Embodiment

The following describes a fourth embodiment. The fourth embodiment is a modification of the configuration between the element isolation portion In and the sense cell region Rs, and other configurations are same as those in the first embodiment, so that description of the other configurations is omitted.

In a situation where the main cell region Rm and the sense cell region Rs are electrically isolated by the element isolation portion In, when the breakdown occurs at the element isolation portion In and the avalanche current increases, it is possible that holes as minority carriers flow into the sense cell region Rs side. In a situation where the holes are concentrated and flow into the sense cell region Rs with a smaller area, it is possible that element breakdown occurs at the sense cell.

Figure 15:
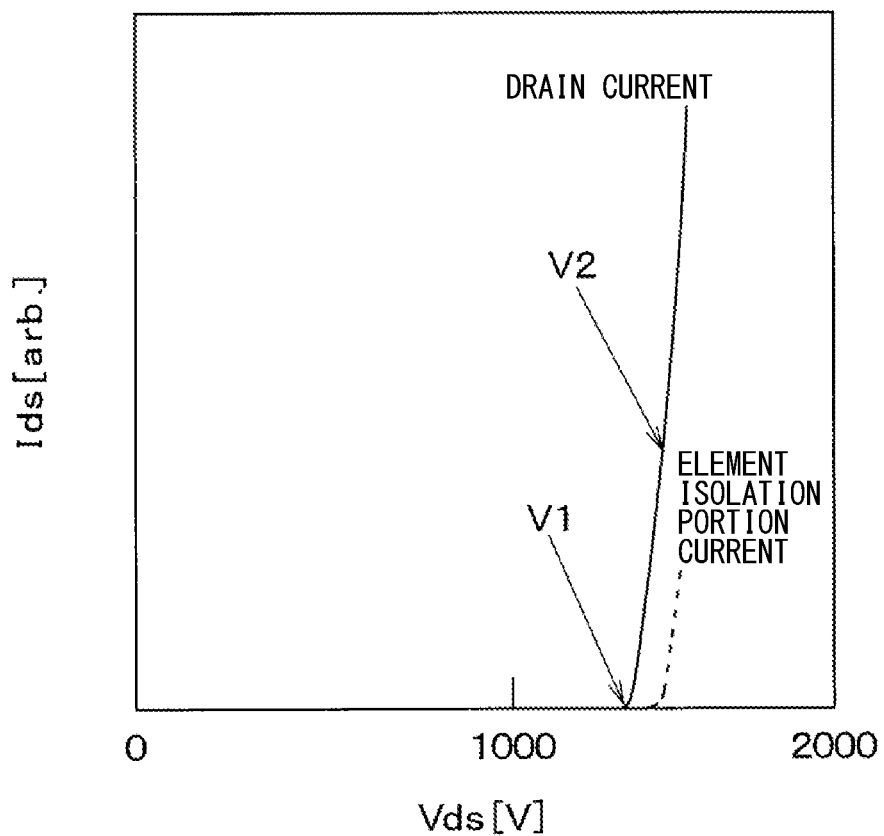
FIG. 15 illustrates changes in drain source voltage Vds and drain-source current Ids.

It is possible that the above-mentioned phenomenon may occur in a design in which the withstand voltage of the element isolation portion In is larger than or equal to the withstand voltage of the main cell region Rm as in the first to third embodiments or in other different designs. In the design such as the first to third embodiments, the withstand voltage is decided at the main cell region Rm; however, the operation voltage rises as the avalanche current increases. As illustrated in FIG. 15, when the voltage rises to a voltage higher than the withstand voltage of the main cell region Rm, the breakdown occurs at the element isolation portion In and the avalanche current flows. In other words, the breakdown occurs at a voltage V1 in the main cell region Rm. However, when the avalanche current, in other words, the drain current increases, the operation voltage rises. The breakdown occurs also in the element isolation portion In at the voltage V2. Subsequently, it is possible that the minority carriers generated at the element isolation portion In flows into the sense cell region Rs side and then may cause the element breakdown.

Figure 16:
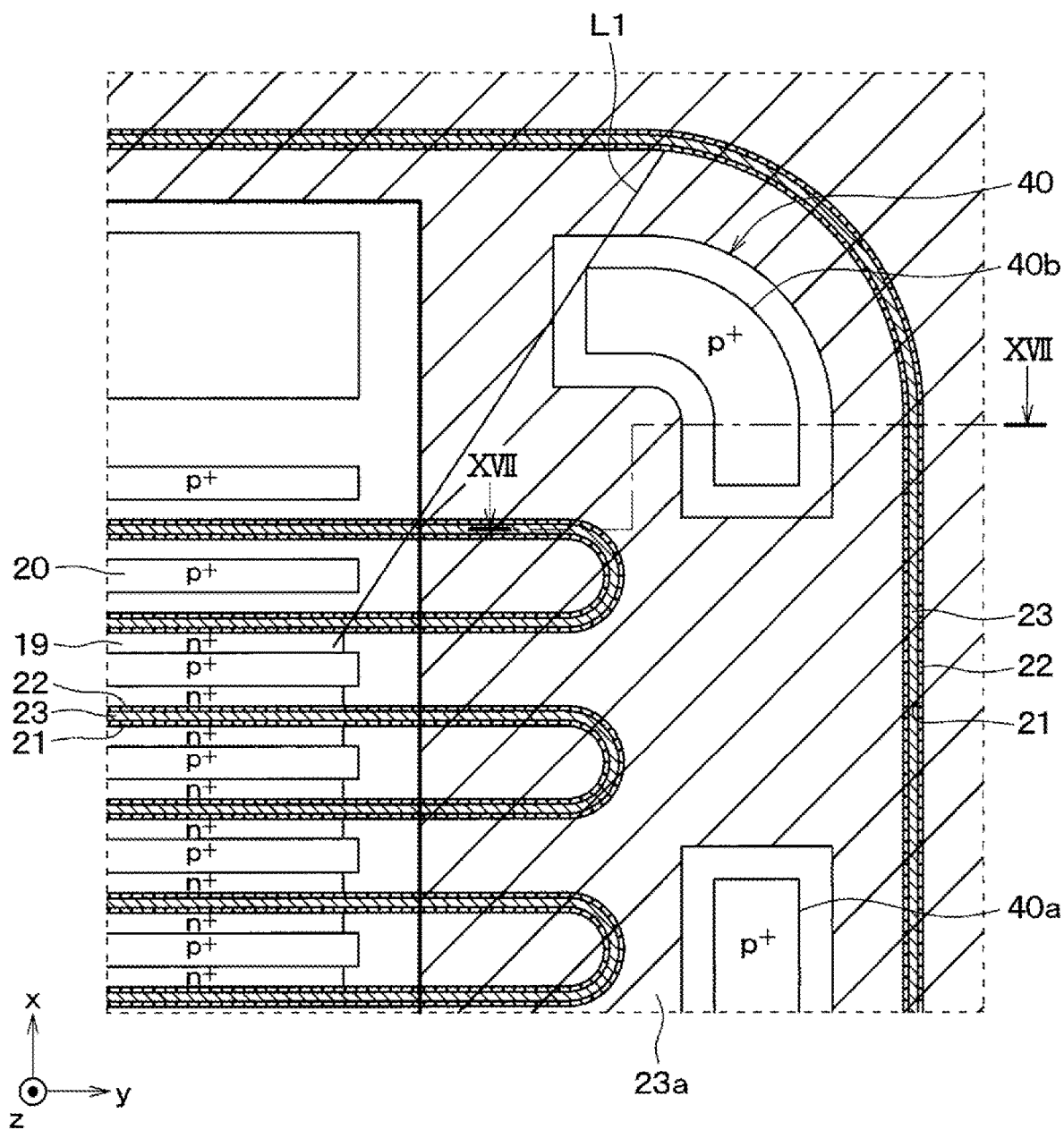
FIG. 16 is a top layout diagram showing a SiC semiconductor device according to a fourth embodiment, and is an enlarged view of a portion corresponding to FIG. 1C.
Figure 17:
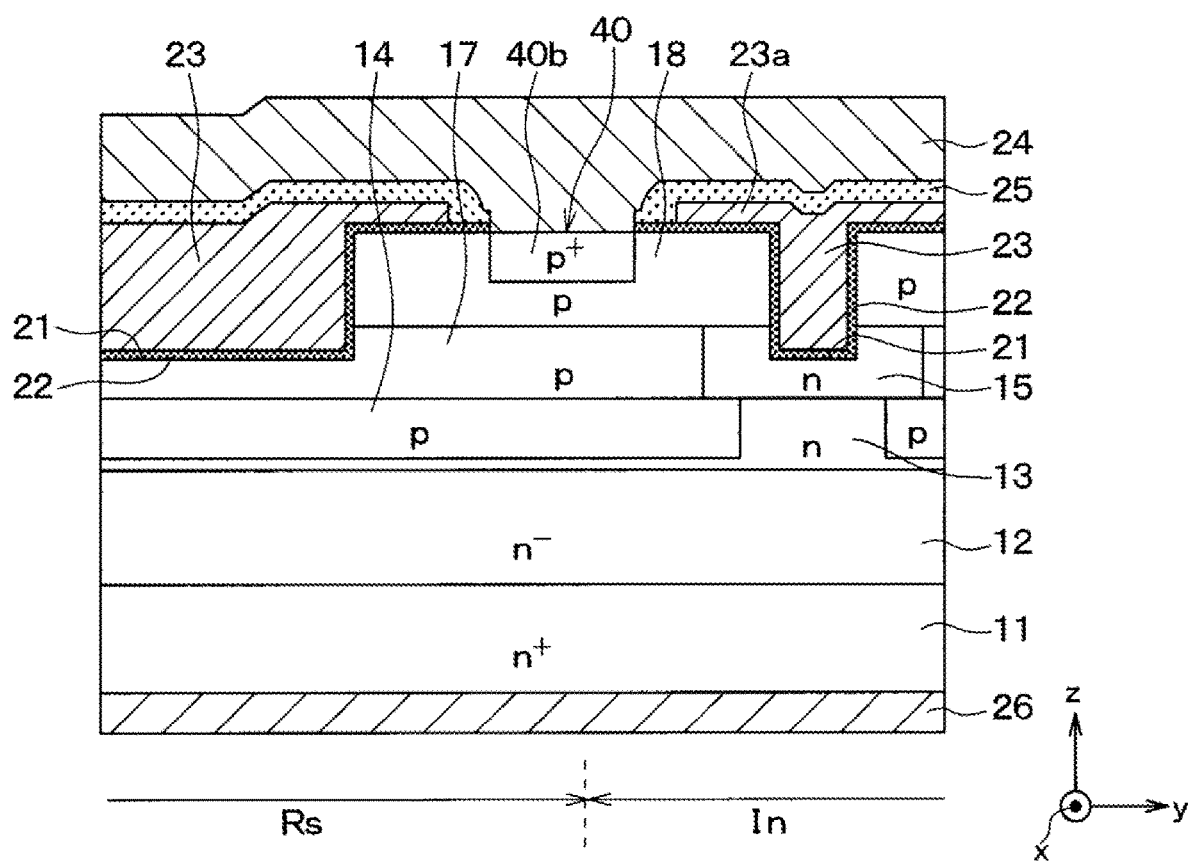
FIG. 17 is a sectional view taken along line XVII-XVII in FIG. 16.

As illustrated in FIGS. 16 and 17, in the present embodiment, a $p^+$-type extraction contact layer 40 for extracting carriers at the surface layer portion of the base region 18 is formed between the element isolation portion In and the sense cell region Rs, and the extraction contact layer 40 is electrically connected to the source electrode 24. As illustrated in FIG. 16, the extraction contact layer 40 is disposed at a position corresponding to each side or each corner portion of the element isolation portion In laid out in a polygonal shape. As illustrated in FIG. 16, a quadrilateral shape is illustrated as the polygonal shape in the present embodiment. The present embodiment includes an extraction contact layer 40a formed at a position corresponding to each side of the element isolation portion In, and an extraction contact layer 40b formed at a position corresponding to each corner portion of the element isolation portion In.

The extraction contact layer 40 may be connected to either the main source electrode 24a or the sense source electrode 24b. However, it is possible to simplify the layout design for the sense source electrode 24b, as the extraction contact layer 40 is connected to the sense source electrode 24b. In other words, the layout design may be difficult because the area of the sense cell region Rs is smaller than that of the main cell region Rm, and the area of the sense source electrode 24b becomes smaller as the sense source electrode 24b is formed only at the sense cell region Rs. On the other hand, as the extraction contact layer 40 is connected to the sense source electrode 24b, the area of the sense source electrode 24b is expanded to the element isolation portion In. Therefore, the expanded area allows the layout design for the sense source electrode 24b to be easier.

In the present embodiment, the extraction contact layer 40 for extracting carriers is formed between the element isolation portion In and the sense cell region Rs, and the carrier extraction is performed through the source electrode 24. Even when the breakdown occurs at the element isolation portion In, the minority carriers generated at the element isolation portion In are extracted through the extraction contact layer 40, and are prevented from flowing into the sense cell region Rs side. Therefore, it is possible to inhibit the element breakdown caused by the inflow of minority carriers into the sense cell region Rs side.

The extraction contact layer 40 may be formed at any position between the sense cell region Rs and the element isolation portion In. However, it may be preferable to dispose the extraction contact layer 40 for covering each corner portion of the element isolation portion In. The element isolation portion In is formed into a quadrilateral shape having four linear sides; however, it may be formed into an arc shape at each of the four corner portions. The element breakdown likely occurs, as minority carriers are easily concentrated at a portion of the arc shape and flow into the sense cell region Rs side.

Therefore, the extraction contact layer 40b is included at a position corresponding to each corner portion of the element isolation portion In. For the extraction contact layer 40b covering each corner portion of the element isolation portion In, a portion of the arc shape of the element isolation portion In is assumed as a fan shape. The extraction contact layer 40b may be formed to straddle two straight lines as the radii of the fan shape.

When the breakdown occurs at the element isolation portion In, the minority carriers generated at the corner portion of the element isolation portion In may flow into a parasitic transistor at the sense cell region Rs, that is, a PNP transistor having the source region 19, the base region 18, and the drift layer 16. Therefore, the extraction contact layer 40b may be arranged to straddle a straight line L1 as illustrated in FIG. 16. The straight line L1 is a straight line connecting the boundary position, which is between the linear portion and the arc portion of the trench gate structure at the element isolation portion In, and the source region 19 at the sense cell region Rs. The straight line L1 forms the shortest distance between the boundary position and the source region 19. In a situation where the extraction contact layer 40b is formed to straddle the straight line L1, the extraction contact layer 40b may extract the minority carriers even though the minority carriers flows into the parasitic transistor side at the shortest distance.

The extraction contact layer 40 described herein may be formed with the ion implantation of p-type impurities by using the predetermined mask after forming the base region 18. For example, when the contact layer 20 is formed, the extraction contact layer 40 may be formed at the same time.

Other Embodiments

While the present disclosure has been described in accordance with the embodiment described above, the present disclosure is not limited to the embodiment and includes various modifications and equivalent modifications. Furthermore, various combinations and aspects, and other combination and aspect including only one element, more than one element or less than one element, are also within the sprit and scope of the present disclosure.

For example, in the embodiments described above, the n-channel MOSFET in which the first conductivity type is n-type and the second conductivity type is p-type has been described as an example of the vertical semiconductor device with the trench gate structure. However, it is not only limited to the above example. Other kinds of vertical semiconductor device with a trench gate structure may also be adopted. For example, the present disclosure may also be applied to a p-channel MOSFET in which the conductivity of each element is inverted. In the above embodiments, the MOSFET of the trench gate structure has been described, but an IGBT of the same trench gate structure may be applied to the present disclosure. The IGBT only changes the conductivity type of the substrate 11 from the n-type to the p-type in each of the above embodiments, and the structures and manufacturing methods are the same as those in each of the above embodiments.

In the first and third embodiments, the first deep layer 14 is disposed inside the first current dispersion layer 13, and the first deep layer 14 is formed shallower than the first current dispersion layer 13. However, it is not limited to this example. The first current dispersion layer 13 and the first deep layer 14 are alternately disposed in the plane direction of the substrate 11, so that the first current dispersion layer 13 may be interposed by the first deep layers 14.

In the first and third embodiments, the second deep layer 17 is extended along the longitudinal direction of the trench gate structure. However, the second deep layer 17 may connect the first deep layer 14 and the base region 18. For example, the second deep layer 17 may be divided into several structures. Furthermore, the contact layer 20 may not be formed. In other words, the source electrode 24 may be connected to the base region 18.

In each of the above embodiments, the gate insulation film 22 may include an oxide film, a nitride film, or the like that is not formed by thermal oxidation.

Further, in each of the above embodiments, after the contact layers 20 has been formed by epitaxially growing a p-type impurity layer on the base region 18, the source regions 19 may be formed.

In the case of indicating the crystal orientation, a bar (−) should be added over a desired number properly. Since there is restriction on expression based on electronic filing, in the present specification, a bar is attached before a desired number.

What is claimed is:

1. A silicon carbide semiconductor device including a cell region having a main cell region and a sense cell region being electrically isolated by an element isolation portion, the silicon carbide semiconductor device comprising:
   a substrate made of silicon carbide and having either a first conductivity type or a second conductivity type;
   a first impurity region disposed on a surface of the substrate, the first impurity region having the first conductivity type and having a lower impurity concentration than the substrate;
   a first current dispersion layer made of silicon carbide and having the first conductivity type, the first current dispersion layer disposed on the first impurity region;
   a plurality of first deep layers made of silicon carbide and having the second conductivity type, the first deep layers disposed above the first impurity region, each of the first deep layers and the first current dispersion layer disposed alternately with respect to a plane direction of the substrate:
   a second current dispersion layer made of silicon carbide and having the first conductivity type, the second current dispersion layer disposed on the first current dispersion layer and the first deep layers, and connected to the first current dispersion layer;
   a second deep layer made of silicon carbide and having the second conductivity type, the second deep layer disposed on the first current dispersion layer and the first deep layers, and connected to the first deep layers;
   a base region made of silicon carbide and having the second conductivity type, the base region disposed on the second current dispersion layer and the second deep layer, and connected to the second deep layers;
   a trench gate structure including a trench, a gate insulation film, and a gate electrode, the trench extending along a direction as a longitudinal direction and disposed to be deeper than the base region, the gate insulation film disposed at an inner wall surface of the trench, and the gate electrode disposed on the gate insulation film inside the trench;

a second impurity region made of silicon carbide and having the first conductivity type, and being in contact with the trench gate structure at a surface layer portion of the base region; and a plurality of first electrodes separately provided in the sense cell region and the main cell region, the first electrodes electrically connected to the second impurity region at the main cell region and the second impurity region at the sense cell region, respectively, and electrically connected to the base region; and a second electrode disposed at a rear surface of the substrate, and electrically connected to the substrate, wherein the first current dispersion layer, the first deep layers, the second current dispersion layer, the second deep layer, the base region, and the trench gate structure are disposed at the cell region and the element isolation region, wherein the second impurity region, the first electrodes, and the second electrode are disposed at the main cell region and the sense cell region to form a vertical semiconductor element at each of the main cell region and the sense cell region, wherein the vertical semiconductor element is configured to allow a current flowing between the first electrode and the second electrode through a voltage applied to the gate electrode, wherein, at the element isolation portion, the first deep layers are disposed at both sides of the trench gate structure and are separated with a spacing interval, and wherein the spacing interval between the first deep layers at the element isolation portion is shorter than or equal to a spacing interval between the first deep layers at the main cell region.

2. The silicon carbide semiconductor device according to claim 1, wherein an impurity concentration of the first current dispersion layer at the element isolation portion is lower than or equal to an impurity concentration of the first current dispersion layer at the main cell region.

3. The silicon carbide semiconductor device according to claim 1, wherein the second deep layer includes a plurality of second deep layers separated with a spacing interval, and wherein a spacing interval between the second deep layers at the element isolation portion is shorter than or equal to a spacing interval between the second deep layers at the main cell region.

4. The silicon carbide semiconductor device according to claim 1, wherein an impurity concentration of the second current dispersion layer at the element isolation portion is lower than or equal to an impurity concentration of the second current dispersion layer at the main cell region.

5. The silicon carbide semiconductor device according to claim 1, wherein a relationship of $y > 2 \times 10^{16}/x^{1.728}$ is satisfied, as an impurity concentration of the first current dispersion layer is defined as y in a unit of $cm^{-3}$ and a length of a narrowest portion of the first current dispersion layer disposed between adjacent first deep layers is defined as x in a unit of μm.

6. The silicon carbide semiconductor device according to claim 1, wherein a relationship of $y < -2 \times 10^{17} x + 3 \times 10^{17}$ is satisfied, as an impurity concentration of the first current dispersion layer is defined as y in a unit of $cm^{-3}$ and a length of a narrowest portion of the first current dispersion layer disposed between adjacent first deep layers is defined as x in a unit of μm.

7. The silicon carbide semiconductor device according to claim 1, wherein each of the first deep layers extends in a direction as a first extending direction intersecting the longitudinal direction of the trench at the cell region, and the second deep layer extends in a direction intersecting the first extending direction.

8. The silicon carbide semiconductor device according to claim 1, wherein the first deep layers and the second deep layers extend in a direction identical to the longitudinal direction of the trench.

9. The silicon carbide semiconductor device according to claim 1, wherein a width of the trench gate structure at the element isolation portion is shorter than or equal to a width of the trench gate structure at the main cell region, and wherein a depth of the trench gate structure at the element isolation portion is deeper than or equal to a depth of the trench gate structure at the main cell region.

10. A silicon carbide semiconductor device including a cell region having a main cell region and a sense cell region being electrically isolated by an element isolation portion, the silicon carbide semiconductor device comprising:

a substrate made of silicon carbide and having either a first conductivity type or a second conductivity type;

a first impurity region disposed on a surface of the substrate, the first impurity region having the first conductivity type and having a lower impurity concentration than the substrate;

a current dispersion layer made of silicon carbide and having the first conductivity type, the current dispersion layer disposed on the first impurity region;

a plurality of deep layers made of silicon carbide and having the second conductivity type, the deep layers disposed above the first impurity region, each of the deep layers and the current dispersion layer disposed alternately with respect to a plane direction of the substrate;

a base region made of silicon carbide and having the second conductivity type, the base region disposed on the current dispersion layer and the deep layer, and connected to the deep layers;

a trench gate structure including a trench, a gate insulation film, and a gate electrode, the trench extending along a direction as a longitudinal direction and disposed to be deeper than the base region, the gate insulation film disposed at an inner wall surface of the trench, and the gate electrode disposed on the gate insulation film inside the trench;

a second impurity region made of silicon carbide and having the first conductivity type, and being in contact with the trench gate structure at a surface layer portion of the base region; and a plurality of first electrodes separately provided in the sense cell region and the main cell region, the first electrodes electrically connected to the second impurity region at the main cell region and the second impurity region at the sense cell region, respectively, and electrically connected to the base region; and a second electrode disposed at a rear surface of the substrate, and electrically connected to the substrate, wherein the current dispersion layer, the deep layers, the base region, and the trench gate structure are disposed at the cell region and the element isolation region, wherein the second impurity region, the first electrodes, and the second electrode are disposed at the main cell region and the sense cell region to form a vertical semiconductor element at each of the main cell region and the sense cell region, wherein the vertical semiconductor element is configured to allow a current flowing between the first electrode and the second electrode through a voltage applied to the gate electrode, wherein, at the element isolation portion, the deep layers are disposed at both sides of the trench gate structure and are separated with a spacing interval, and wherein the spacing interval between the deep layers at the element isolation portion is shorter than or equal to a spacing interval between the deep layers at the main cell region.

11. The silicon carbide semiconductor device according to claim 10, wherein an impurity concentration of the current dispersion layer at the element isolation portion is lower than or equal to an impurity concentration of the current dispersion layer at the main cell region.

12. The silicon carbide semiconductor device according to claim 10, wherein a width of the trench gate structure at the element isolation portion is shorter than or equal to a width of the trench gate structure at the main cell region, and wherein a depth of the trench gate structure at the element isolation portion is deeper than or equal to a depth of the trench gate structure at the main cell region.

13. The silicon carbide semiconductor device according to claim 1, wherein the gate electrode at the element isolation portion is electrically connected to the gate electrode at the main cell region and the sense cell region.

14. The silicon carbide semiconductor device according to claim 1, wherein the gate electrode at the element isolation portion is extended to outside of the trench and has a T-shape in a cross section.

15. The silicon carbide semiconductor device according to claim 1, wherein the element isolation portion has a polygonal shape surrounding the sense cell, and the polygonal shape has a corner portion with an arc shape, wherein the base region is also disposed between the element isolation portion and the sense cell region, and wherein an extraction contact layer having the second conductivity type is disposed at a surface layer portion of the base region located between the element isolation portion and the sense cell portion, and is connected to either the first electrode at the main cell region or the first electrode at the sense cell region.

16. The silicon carbide semiconductor device according to claim 15, wherein the extraction contact layer covers the corner portion of the element isolation portion.

17. The silicon carbide semiconductor device according to claim 15, wherein the extraction contact layer straddles a straight line connecting between a boundary position and the second impurity region at the sense cell region in a shortest distance, and wherein the boundary position is between a portion of a linear shape included in each side of the polygonal shape of the element isolation portion and a portion of the arc shape included in the corner portion of the element isolation portion.

18. The silicon carbide semiconductor device according to claim 15, wherein the extraction contact layer is disposed between all of sides of the polygonal shape of the element isolation portion and the sense cell region.

* * * * *